(12) United States Patent
Tai et al.

(10) Patent No.: US 11,177,221 B2
(45) Date of Patent: Nov. 16, 2021

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Li-Hua Tai, Kaohsiung (TW); Yueh-Ju Lin, Kaohsiung (TW); Wen Shang Chang, Kaohsiung (TW); Wen-Pin Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/657,882

(22) Filed: Oct. 18, 2019

(65) Prior Publication Data

US 2021/0118806 A1   Apr. 22, 2021

(51) Int. Cl.
| | |
|---|---|
| H01L 23/538 | (2006.01) |
| H01L 23/31 | (2006.01) |
| H01L 23/552 | (2006.01) |
| H01L 23/00 | (2006.01) |
| H01L 21/48 | (2006.01) |
| H01L 21/56 | (2006.01) |

(52) U.S. Cl.
CPC ...... *H01L 23/5389* (2013.01); *H01L 21/4853* (2013.01); *H01L 21/4857* (2013.01); *H01L 21/565* (2013.01); *H01L 23/3128* (2013.01); *H01L 23/5383* (2013.01); *H01L 23/5386* (2013.01); *H01L 23/552* (2013.01); *H01L 24/19* (2013.01); *H01L 24/20* (2013.01); *H01L 2224/214* (2013.01); *H01L 2924/3025* (2013.01)

(58) Field of Classification Search
CPC ............ H01L 23/5389; H01L 23/3128; H01L 23/5383; H01L 23/5386; H01L 23/552; H01L 21/4853; H01L 21/4857; H01L 21/565; H01L 24/19; H01L 24/20; H01L 2224/214; H01L 2924/3025
USPC ........................................................ 257/659
See application file for complete search history.

(56) References Cited

U.S. PATENT DOCUMENTS

| | | | |
|---|---|---|---|
| 2016/0148857 A1* | 5/2016 | Lin | H01L 24/97 257/762 |
| 2017/0170155 A1* | 6/2017 | Yu | H01L 25/50 |
| 2018/0138155 A1* | 5/2018 | Kim | H01L 23/552 |
| 2019/0131273 A1* | 5/2019 | Chen | H01L 21/568 |
| 2019/0189565 A1* | 6/2019 | Chen | H01L 21/565 |

* cited by examiner

*Primary Examiner* — Tong-Ho Kim
(74) *Attorney, Agent, or Firm* — Foley & Lardner LLP

(57) ABSTRACT

A semiconductor device package includes a first carrier, a first electronic component, a second electronic component, a second carrier and an electrical connection structure. The first carrier has a first surface and a second surface opposite to the first surface. The first electronic component is disposed on the first surface of the first carrier. The second electronic component is disposed on the second surface of the first carrier. The second carrier has a first surface facing the second surface of the first carrier and a second surface opposite to the first surface. The electrical connection structure is electrically connecting the first carrier with the second carrier.

22 Claims, 30 Drawing Sheets

SEMICONDUCTOR DEVICE PACKAGE AND METHOD OF MANUFACTURING THE SAME

BACKGROUND

1. Technical Field

The present disclosure relates to a semiconductor device package and a method of manufacturing the same.

2. Description of the Related Art

A semiconductor package device may include multiple electronic components to increase its performance and functionality. To reduce the area or footprint of a semiconductor package device, electronic components may be mounted to both a top surface and a bottom surface of a substrate. In some embodiments, the electronic components can be arranged side-by-side on the top surface or the bottom surface of the substrate. However, this will increase the area of semiconductor device package. In other embodiments, the electronic components may be arranged in a stacking arrangement. However, this will increase the thickness of the semiconductor device package, which will in turn hinder the semiconductor device package from being connected to another circuit board.

SUMMARY

In accordance with some embodiments of the present disclosure, a semiconductor device package includes a first carrier, a first electronic component, a second electronic component, a second carrier and an electrical connection structure. The first carrier has a first surface and a second surface opposite to the first surface. The first electronic component is disposed on the first surface of the first carrier. The second electronic component is disposed on the second surface of the first carrier. The second carrier has a first surface facing the second surface of the first carrier and a second surface opposite to the first surface. The electrical connection structure is electrically connecting the first carrier with the second carrier.

In accordance with some embodiments of the present disclosure, a method of manufacturing a semiconductor device package includes (a) forming a first carrier having a first surface and a second surface opposite to the first surface; (b) disposing a first electronic component on the first surface of the first carrier; (c) forming an electrical connection structure and a second electronic component on the second surface of the first carrier; and (d) forming a second carrier to be electrically connected to the electrical connection structure. The first carrier and the second carrier include different materials.

Figure 1:
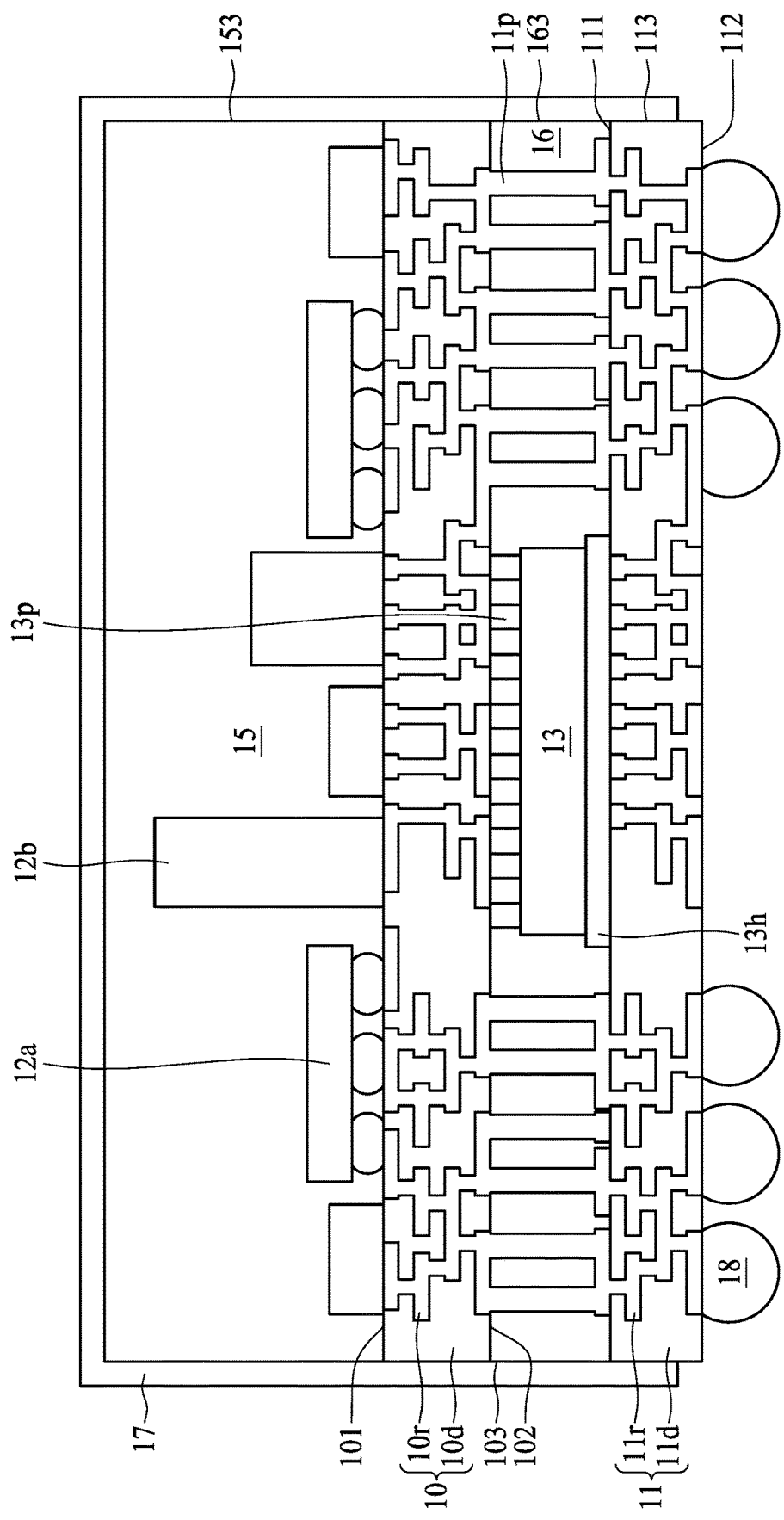
FIG. 1 illustrates a cross-sectional view of a semiconductor device package in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

FIG. 1 illustrates a cross-sectional view of a semiconductor device package 1 in accordance with some embodiments of the present disclosure. The semiconductor device package 1 includes carriers 10, 11, electronic components 12a, 12b, 13, package bodies 15, 16, a shield 17 and electrical contacts 18.

In some embodiments, the carrier 10 may be a circuit layer including an interconnection layer (e.g., redistribution layer, RDL) 10r and a dielectric layer 10d. A portion of the interconnection layer 10r is covered or encapsulated by the dielectric layer 10d while another portion of the interconnection layer 10r is exposed from the dielectric layer 10d to provide electrical connections. The carrier 10 has a surface 101, a surface 102 opposite to the surface 101 and a lateral surface 103 extending between the surface 101 and the surface 102.

In some embodiments, the dielectric layer 10d may include an organic material, a solder mask, a polyimide (PI), an epoxy, an Ajinomoto build-up film (ABF), one or more molding compounds, one or more pre-impregnated composite fibers (e.g., a pre-preg fiber), a borophosphosilicate glass (BPSG), a silicon oxide, a silicon nitride, a silicon oxynitride, an undoped silicate glass (USG), any combination thereof, or the like. Examples of molding compounds may include, but are not limited to, an epoxy resin including fillers dispersed therein. Examples of a pre-preg fiber may include, but are not limited to, a multi-layer structure formed by stacking or laminating one or more pre-impregnated materials or sheets. In some embodiments, the dielectric layer 10d may include an inorganic material, such as silicon, a ceramic or the like. In some embodiments, there may be any number of interconnection layers 10r depending on design specifications. In some embodiments, a thickness of the circuit layer 10 is less than 100 micrometer (μm). For example, the thickness of the circuit layer 10 is equal to or less than about 60 μm. In some embodiments, the line/space (L/S) of the interconnection layer 10r is less than 20 μm/20 μm. For example, the L/S of the interconnection layer 10r is less than 12 μm/12 μm. For example, the L/S of the interconnection layer 10r is equal to or less than 2 μm/2 μm.

In other embodiments, the carrier 10 may be replaced by a substrate (e.g., printed circuit board (PCB)), such as a paper-based copper foil laminate, a composite copper foil laminate, a polymer-impregnated glass-fiber-based copper foil laminate, or a combination of two or more thereof. In some embodiments, the substrate 10 is or includes a multi-layer substrate. By utilizing a substrate as the carrier 10, a thickness of the carrier 10 is greater than 100 μm. For example, a thickness of the carrier 10 is equal to or greater than 500 μm. By utilizing a substrate as the carrier 10, the L/S of the interconnection structure within the carrier 10 is greater than 12 μm/12 μm.

The carrier 11 has a surface 111, a surface 112 opposite to the surface 111 and a lateral surface 113 extending between the surface 111 and the surface 112. In some embodiments, the carrier 11 is a circuit layer including an interconnection layer 11r (e.g., RDL) and a dielectric layer 11d. The carrier 11 is similar to the carrier 10, and the descriptions for the carrier 10 are applicable to the carrier 11. In some embodiments, a thickness of the carrier 11 is equal to or less than about 40 μm. The carrier 11 is electrically connected to the carrier 10 through electrical connections 11p (e.g., copper pillars or solder balls).

In some embodiments, the carrier 10 and the carrier 11 may be formed of or include the same material or different materials depending on different design specifications. For example, both the carrier 10 and the carrier 11 are substrates. For example, the carrier 10 is a substrate and the carrier 11 is a circuit layer. For example, the carrier 10 is a circuit layer and the carrier 11 is a substrate. For example, the carrier 10 is a substrate and the carrier 11 is a flexible printed circuit (FPC) board. Compared with using a substrate as the carrier 10 and/or the carrier 11, using circuit layers as the carriers 10 and 11 as shown in FIG. 1 can achieve a fine-pitch connection (e.g., equal to or less than 2 μm/2 μm), and the thickness of the semiconductor device package 1 can be reduced.

The electronic components 12a and 12b are disposed on the surface 101 of the carrier 10. The electronic components 12a may be an active component or another semiconductor device, such as an integrated circuit (IC) chip or a die. In some embodiments, the electronic components 12a could be any active component or another semiconductor package device. The electronic components 12b may be passive components, such as capacitors, resistors or inductors. The electronic components 12a and 12b may be electrically connected to one or more of another electronic component and/or the carrier 10 (e.g., to the interconnection layer 10r), and electrical connection may be attained by way of flip-chip, wire-bond techniques or surface mount technology (SMT).

The package body 15 is disposed on the surface 101 of the carrier 10 and covers the electronic components 12a and 12b. In some embodiments, the package body 15 includes an epoxy resin including fillers, a molding compound (e.g., an epoxy molding compound or other molding compound), a polyimide, a phenolic compound or material, a material including a silicone dispersed therein, or a combination thereof.

The electronic component 13 is disposed between the carriers 10 and 11. A backside surface of the electronic component 13 is connected to the surface 111 of the carrier 11 through an adhesive layer (e.g., die attach film, DAF) 13h. In some embodiments, a thickness of the adhesive layer 13h is about 10 μm. An active surface of the electronic component 13 is electrically connected to the surface 102 of the carrier 10 (e.g., to the interconnection layer 10r of the carrier 10) through conductive pillars 13p. The electronic component 13 may be an active component, such as an IC chip or a die. In some embodiments, the electronic component 13 is a system-on-a-chip (SoC), which may include one or more processors, controllers or any other suitable electronic devices. In some embodiments, there may be any number of electronic components (including passive components and/or active components) disposed between the carriers 10 and 11 depending on different design specifications.

The package body 16 is disposed between the carriers 10 and 11, and covers the electronic component 13 (including the adhesive layer 13h and conductive pillars 13p) and electrical connections 11p. In some embodiments, the package body 16 includes an epoxy resin including fillers, a molding compound (e.g., an epoxy molding compound or other molding compound), a polyimide, a phenolic compound or material, a material including a silicone dispersed therein, or a combination thereof. The package body 16 and the package body 15 may include the same material or different materials depending on different design specifications.

The shield 17 is disposed on external surfaces of the package body 15 (e.g., a top surface and a lateral surface 153) and covers the package body 15 and electrical components 12a, 12b. The shield 17 is disposed on the lateral surface 103 of the carrier 10 and the lateral surface 163 of the package body 16 to cover the electronic component 13. The shield 17 is disposed on a portion of the lateral surface 113 of the carrier 11 and exposes the other portion of the lateral surface 113 of the carrier 11. The shield 17 is electrically connected to grounding elements of the carrier 10 and/or 11. In some embodiments, the shield 17 is a conductive thin film, and may include, for example, aluminum (Al), copper (Cu), chromium (Cr), tin (Sn), gold (Au), silver (Ag), nickel (Ni) or stainless steel, or a mixture, an alloy, or other combination thereof. The shield 17 may include a single conductive layer or multiple conductive layers. In some embodiments, the shield 17 includes multiple conductive layers, and the multiple conductive layers may include a same material, or ones of the multiple conductive layers may include different materials, or each of the multiple conductive layers may include different materials from others of the multiple conductive layers. The shield 17 can prevent the electronic components 12a, 12b and 13 from electromagnetic interference (EMI).

The electrical contacts 18 are disposed on the surface 112 of the carrier 11 and electrically connected to the carrier 11. In some embodiments, the electrical contacts 18 are Controlled Collapse Chip Connection (C4) bumps, solder bumps, one or more Land Grid Arrays (LGA), or a combination of two or more thereof.

Figure 2:
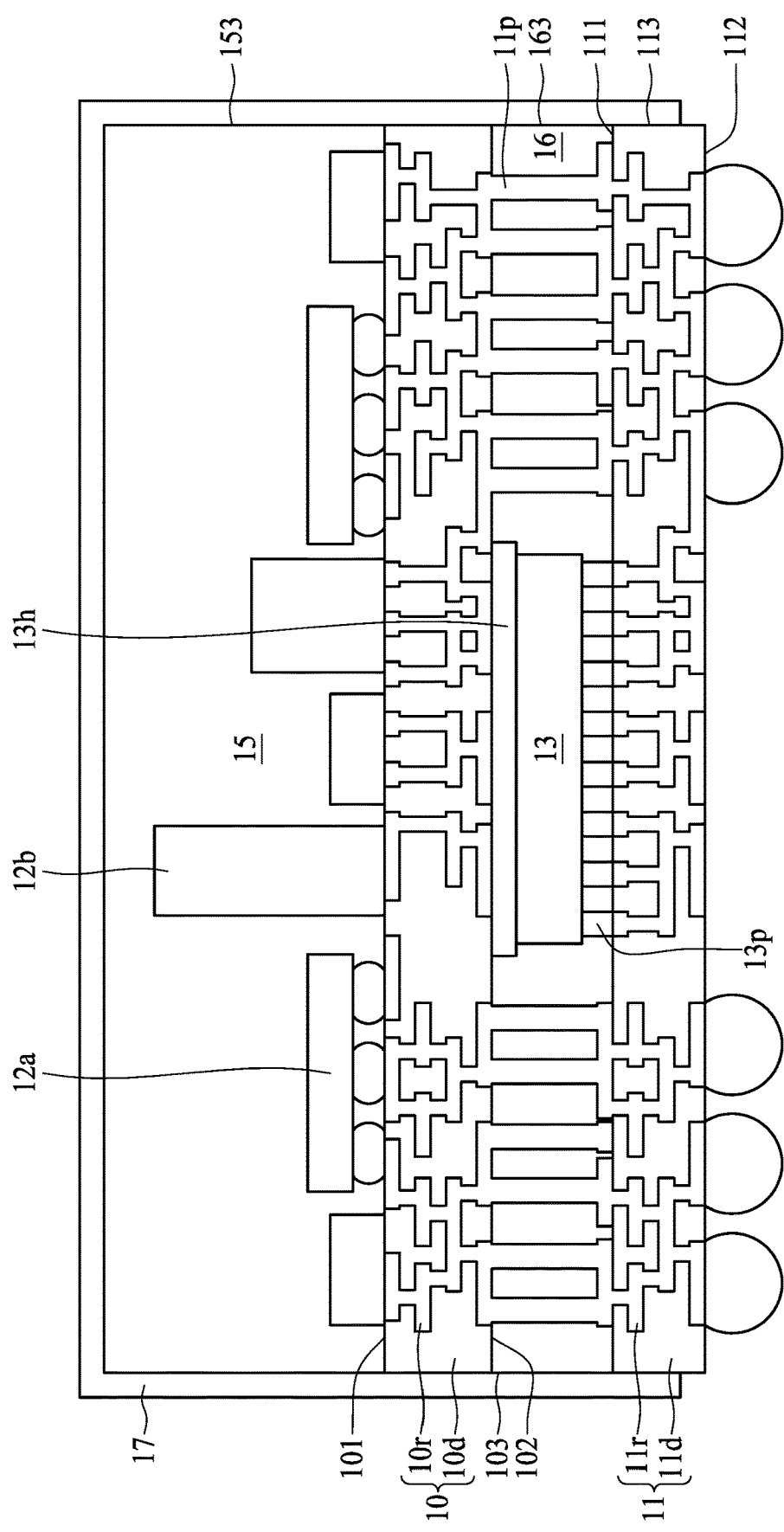
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 is similar to the semiconductor device package 1 in FIG. 1, and the differences therebetween are described blow.

The backside surface of the electronic component 13 is connected to the surface 102 of the carrier 10 through the adhesive layer 13h. The active surface of the electronic component 13 is electrically connected to the surface 111 of the carrier 11 (e.g., to the interconnection layer 11r of the carrier 11) through the conductive pillars 13p.

Figure 3A:
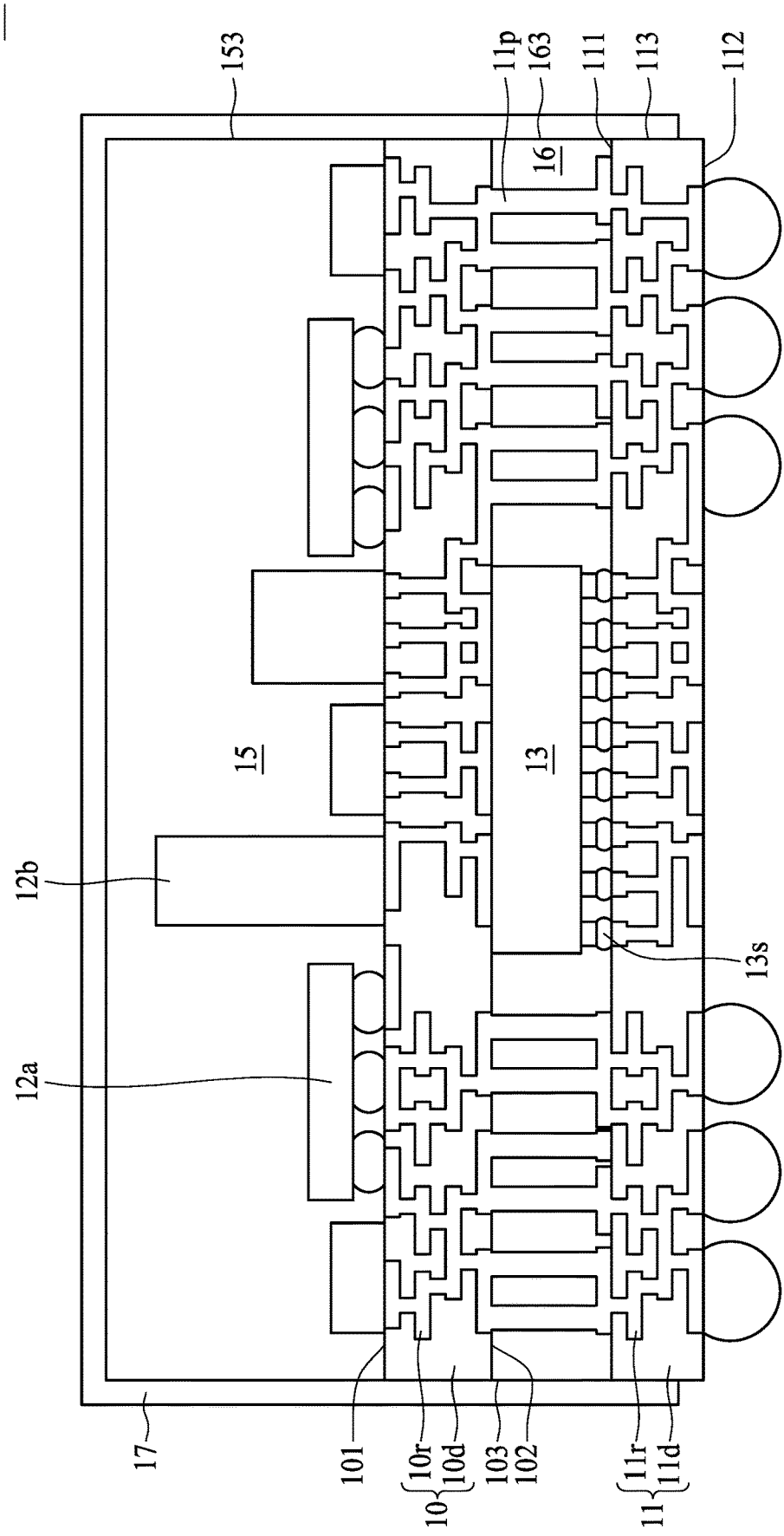
FIG. 3A illustrates a cross-sectional view of a semiconductor device package in accordance with some embodiments of the present disclosure.

FIG. 3A illustrates a cross-sectional view of a semiconductor device package 3A in accordance with some embodiments of the present disclosure. The semiconductor device package 3A is similar to the semiconductor device package 2 in FIG. 2, and the differences therebetween are described blow.

The electronic component 13 is electrically connected to the surface 111 of the carrier 11 (e.g., to the interconnection layer 11r of the carrier 11) through solder balls 13s. In some embodiments, the backside surface of the electronic component 13 is spaced apart from the surface 102 of the carrier 10. For example, there is a gap between the backside surface of the electronic component 13 and the surface 102 of the carrier 10. In other embodiments, the backside surface of the electronic component 13 directly contacts the surface 102 of the carrier 10.

Figure 3B:
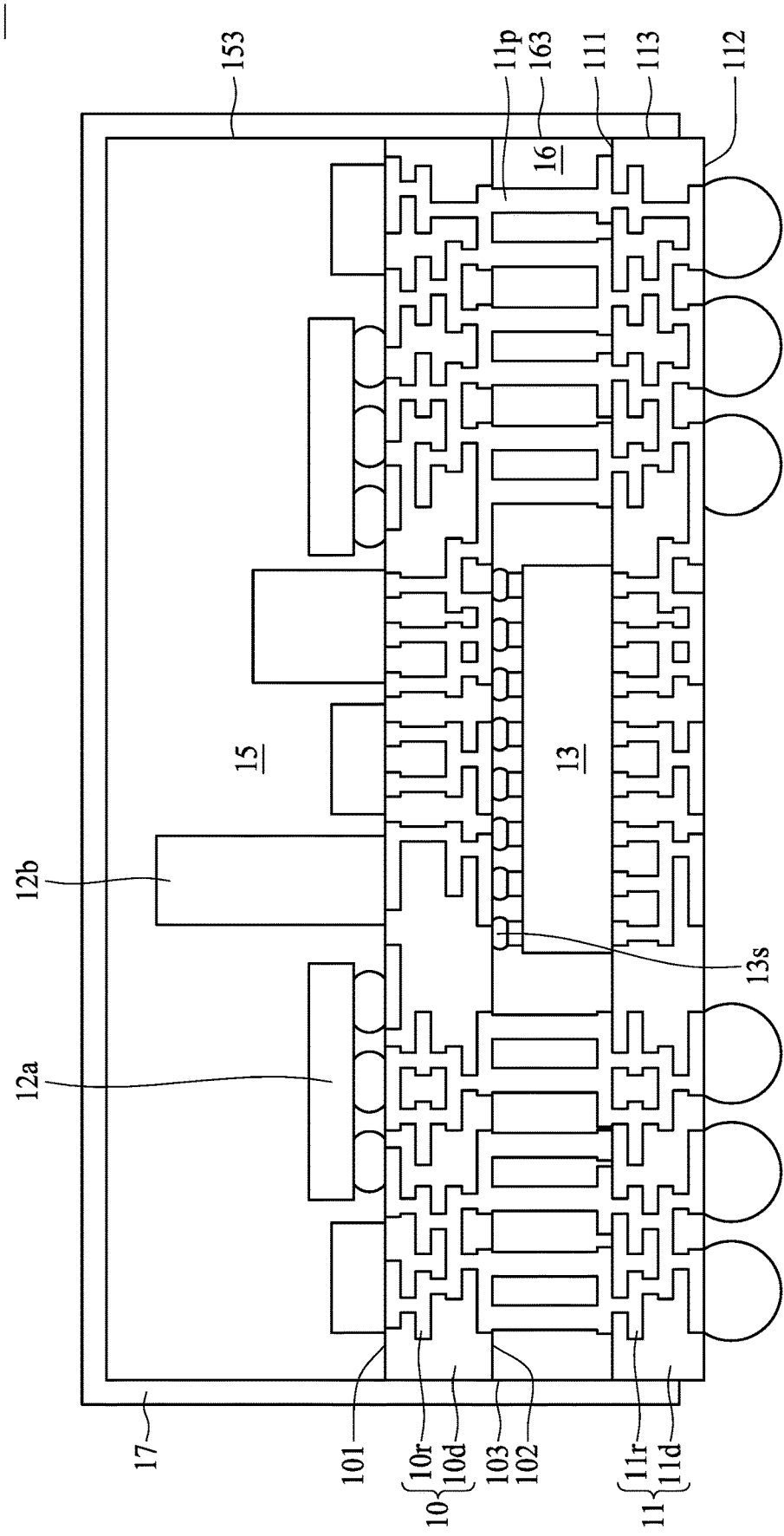
FIG. 3B illustrates a cross-sectional view of a semiconductor device package in accordance with some embodiments of the present disclosure.

FIG. 3B illustrates a cross-sectional view of a semiconductor device package 3B in accordance with some embodiments of the present disclosure. The semiconductor device package 3B is similar to the semiconductor device package 3A in FIG. 3A, and the differences therebetween are described blow.

The electronic component 13 is electrically connected to the surface 102 of the carrier 10 (e.g., to the interconnection layer 10r of the carrier 10) through the solder balls 13s. In some embodiments, the backside surface of the electronic component 13 is spaced apart from the surface 111 of the carrier 11. For example, there is a gap between the backside surface of the electronic component 13 and the surface 111 of the carrier 11. In other embodiments, the backside surface of the electronic component 13 directly contacts the surface 111 of the carrier 11.

FIG. 4A, FIG. 4B, FIG. 4C, FIG. 4D, FIG. 4E, FIG. 4F, FIG. 4G, FIG. 4H, FIG. 4I and FIG. 4J illustrate a semiconductor manufacturing method in accordance with some embodiments of the present disclosure. In some embodiments, the method in FIG. 4A, FIG. 4B, FIG. 4C, FIG. 4D, FIG. 4E, FIG. 4F, FIG. 4G, FIG. 4H, FIG. 4I and FIG. 4J can be used to manufacture the semiconductor device package 1 in FIG. 1.

Figure 4A:
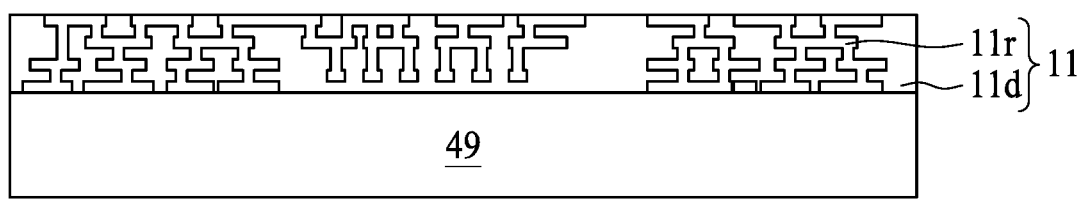
FIG. 4A, FIG. 4B, FIG. 4C, FIG. 4D, FIG. 4E, FIG. 4F, FIG. 4G, FIG. 4H, FIG. 4I and FIG. 4J illustrate a semiconductor manufacturing method in accordance with some embodiments of the present disclosure.

Referring to FIG. 4A, a carrier 49 (e.g., a glass carrier) is provided. A carrier 11 (or a strip of carriers including the carrier 11) including an interconnection layer 11r (e.g., RDL) and a dielectric layer 11d is formed on the carrier 49. In some embodiments, the interconnection layer 11r may be formed by, for example, plating or any other suitable processes. The dielectric layer 11d is formed to cover a portion of the interconnection layer 11r and to expose the other portion of the interconnection layer 11r for electrical connections.

Figure 4B:
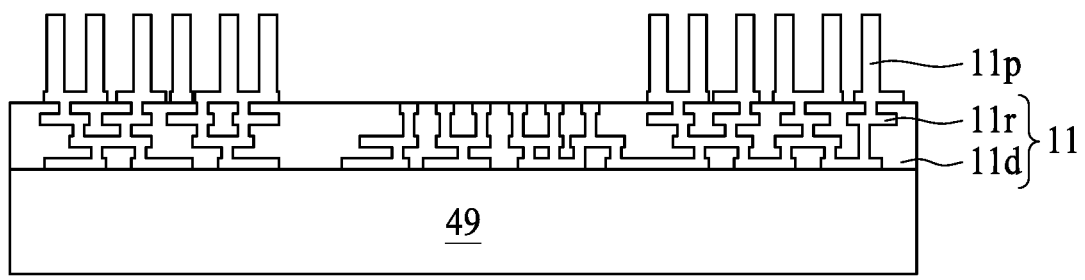

Referring to FIG. 4B, one or more electrical connections (e.g., conductive pillars) 11p are formed on the interconnection layer 11r exposed from the dielectric layer 11d. In some embodiments, the electrical connections 11p may be formed by, for example, plating or any other suitable processes.

Figure 4C:
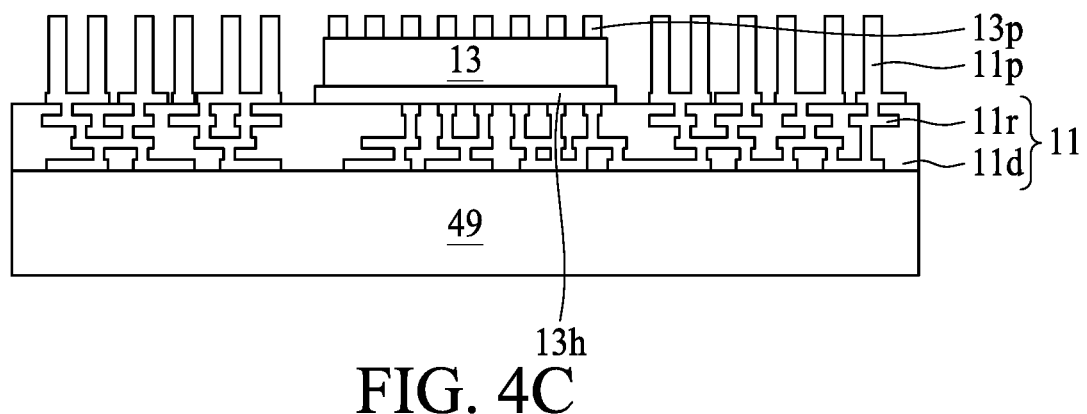

Referring to FIG. 4C, an electronic component 13 is disposed on the carrier 11. For example, a backside surface of the electronic component 13 is connected to the carrier 11 through an adhesive layer 13h (e.g., DAF).

Figure 4D:
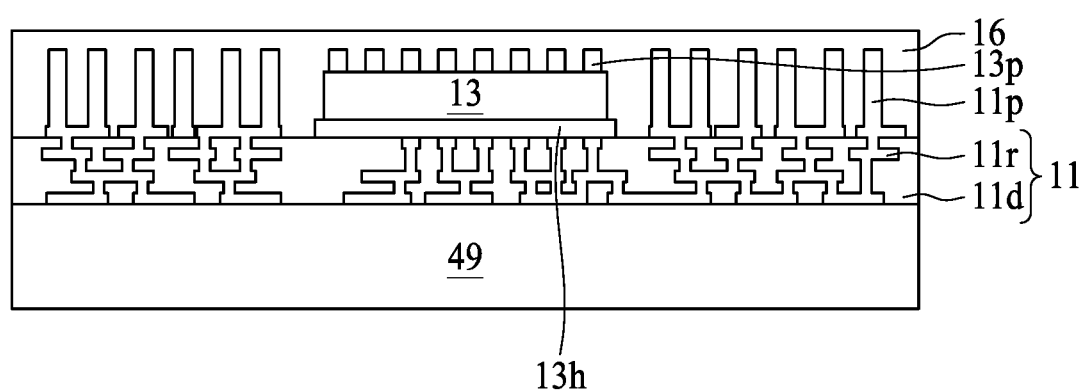

Referring to FIG. 4D, a package body 16 is formed on the carrier 11 to cover the electronic component 13 and the electrical connections 11p. In some embodiments, the package body 16 fully covers the electronic component 13 (including the conductive pillars 13p) and the electrical connections 11p. The package body 16 may be formed by, for example, molding or any other suitable processes.

Figure 4E:
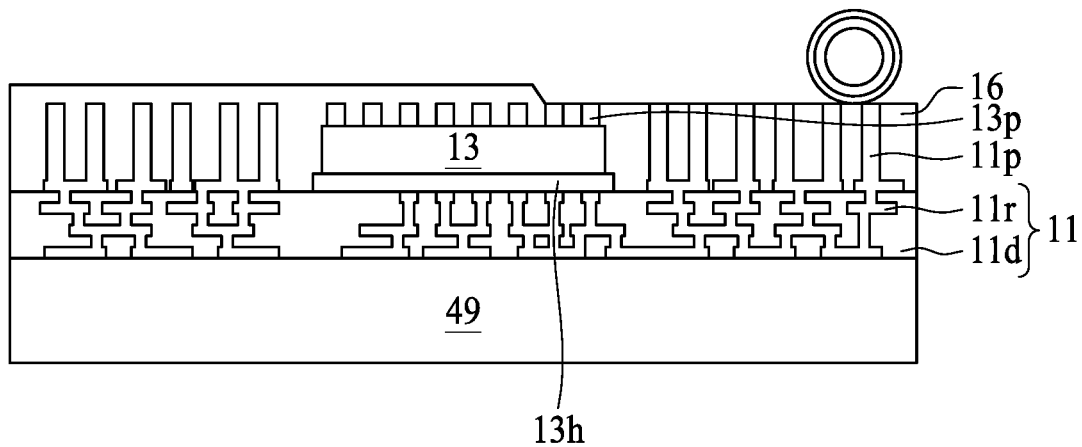

Referring to FIG. 4E, a portion of the package body 16 is removed to expose the electrical connections 11p and the conductive pillars 13p. In some embodiments, the package body 16 is removed by, for example, grinding or any other suitable processes.

Figure 4F:
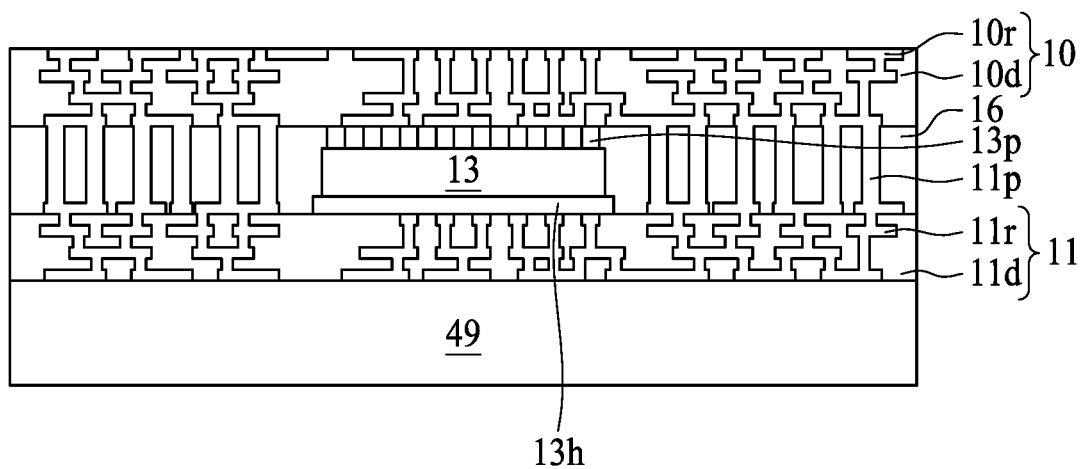

Referring to FIG. 4F, a carrier 10 including an interconnection layer 10r (e.g., RDL) and a dielectric layer 10d is formed on the package body 16. The interconnection layer 10r of the carrier 10 is electrically connected to the electrical connections 11p and the conductive pillars 13p exposed from the package body 16. In some embodiments, the interconnection layer 10r may be formed by, for example, plating or any other suitable processes. The dielectric layer 10d is formed to cover a portion of the interconnection layer 10r and to expose the other portion of the interconnection layer 10r for electrical connections.

Figure 4G:
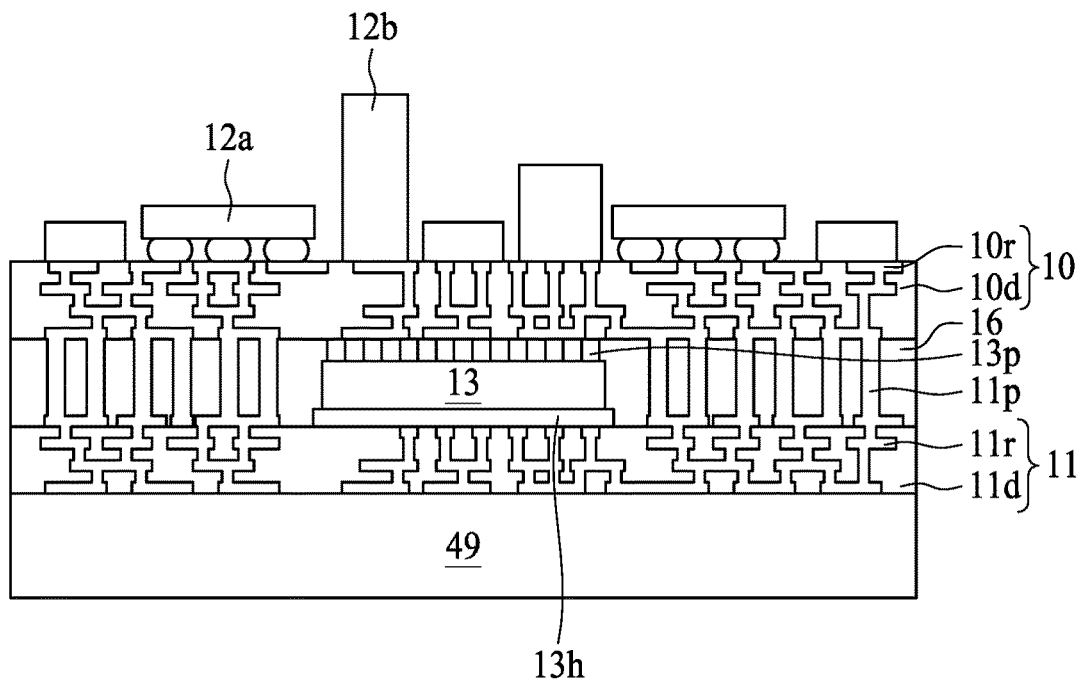

Referring to FIG. 4G, electronic components 12a and 12b are disposed on the carrier 10 and electrically connected to the interconnection layer 10r exposed from the dielectric layer 10d. In some embodiments, the electronic components 12a and 12b are disposed on the carrier 10 by, for example, surface mount technology (SMT) or any other suitable processes.

Figure 4H:
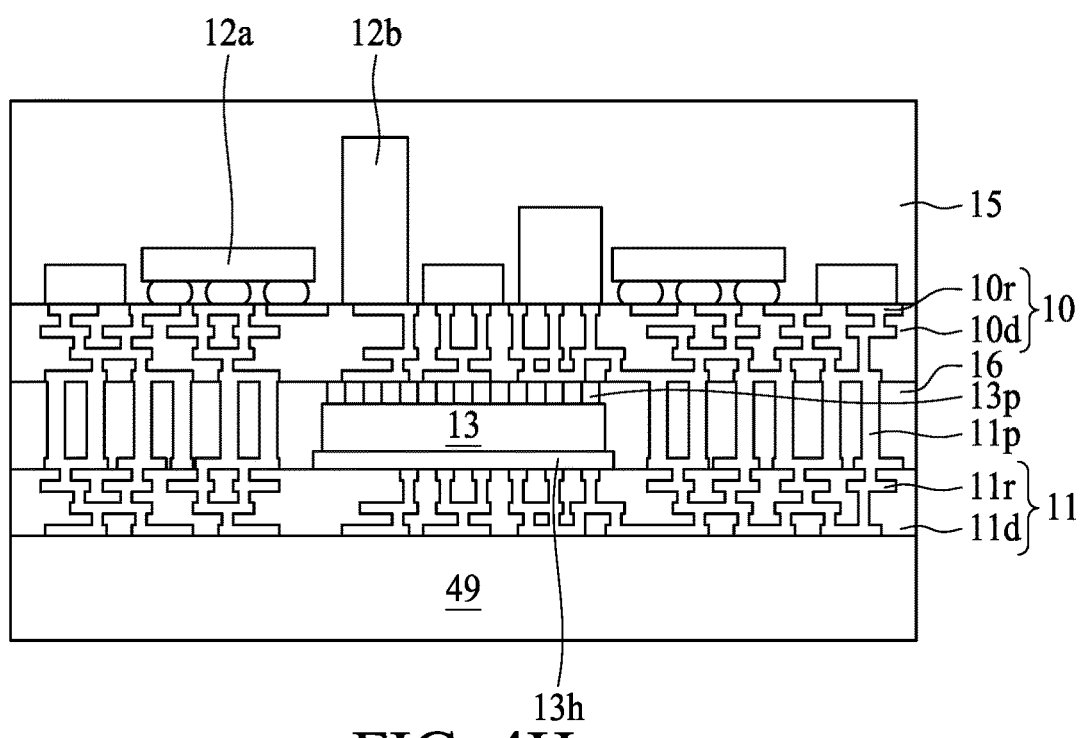

Referring to FIG. 4H, a package body 15 is formed on the carrier 10 to cover the electronic components 12a and 12b. In some embodiments, the package body 15 fully covers the electronic component 12a and 12b. The package body 15 may be formed by, for example, molding or any other suitable processes.

Figure 4I:
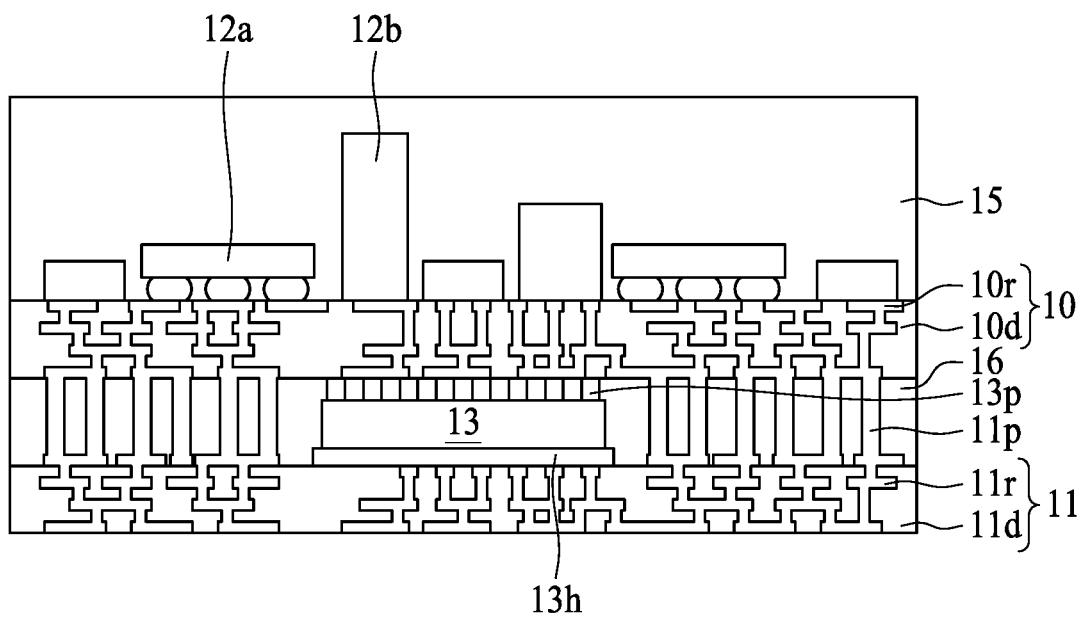

Referring to FIG. 4I, the carrier 49 is removed from the carrier 11 (e.g., de-bonding operation) to expose a surface the carrier 11 facing away from the electronic component 13.

Figure 4J:
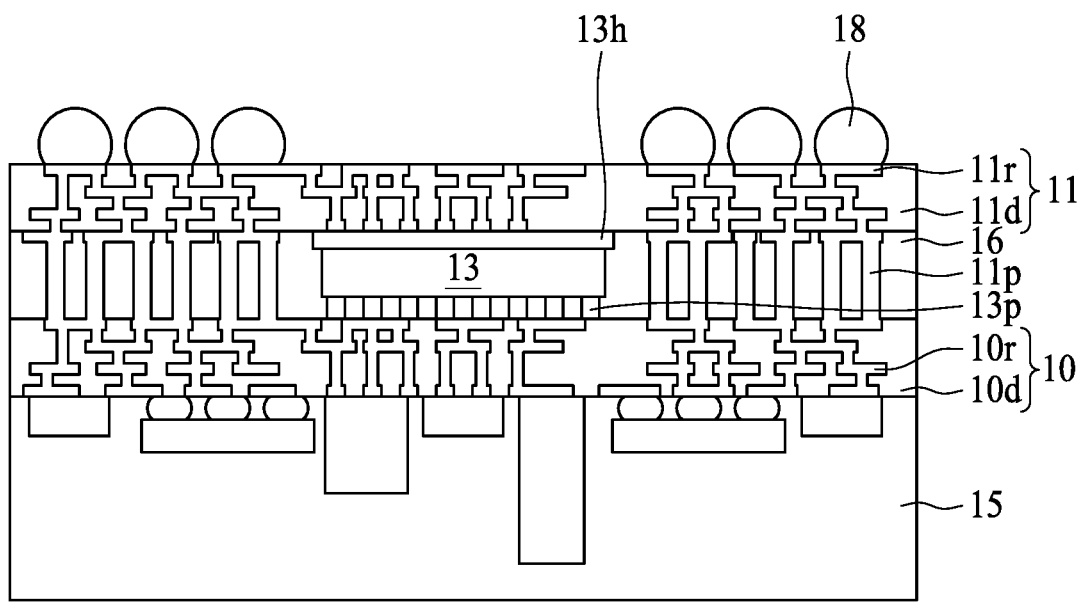

Referring to FIG. 4J, electrical contacts 18 (e.g., solder balls) are formed on the surface of the carrier 11 facing away from the electronic component 13. In some embodiments, a singulation may be performed by, for example, sawing or any other suitable processes.

Then, a shield 17 is formed on external surfaces of the package body 15 (e.g., a top surface and a lateral surface), the lateral surface of the carrier 10, the lateral surface of the package body 16 and a portion of the lateral surface of the carrier 11 to form the semiconductor device package 1 as shown in FIG. 1 In some embodiments, the shield 17 is formed by, for example, sputtering (e.g., selective sputtering).

FIG. 5A, FIG. 5B, FIG. 5C, FIG. 5D, FIG. 5E, FIG. 5F, FIG. 5G, FIG. 5H, FIG. 5I and FIG. 5J illustrate a semiconductor manufacturing method in accordance with some embodiments of the present disclosure. In some embodiments, the method in FIG. 5A, FIG. 5B, FIG. 5C, FIG. 5D, FIG. 5E, FIG. 5F, FIG. 5G, FIG. 5H, FIG. 5I and FIG. 5J can be used to manufacture the semiconductor device package 2 in FIG. 2.

Figure 5A:
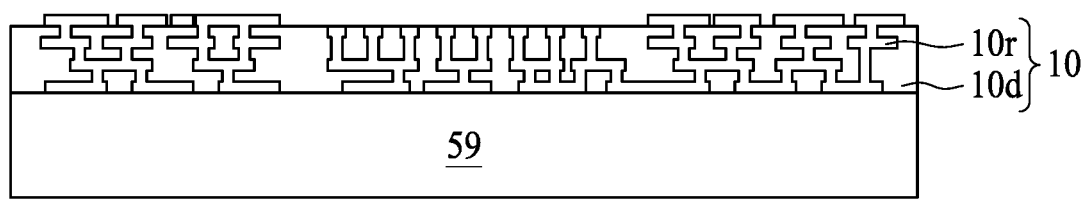
FIG. 5A, FIG. 5B, FIG. 5C, FIG. 5D, FIG. 5E, FIG. 5F, FIG. 5G, FIG. 5H, FIG. 5I and FIG. 5J illustrate a semiconductor manufacturing method in accordance with some embodiments of the present disclosure.

Referring to FIG. 5A, a carrier 59 (e.g., a glass carrier) is provided. A carrier 10 (or a strip of carriers including the carrier 10) including an interconnection layer 10r (e.g., RDL) and a dielectric layer 10d is formed on the carrier 59. In some embodiments, the interconnection layer 10r may be formed by, for example, plating or any other suitable processes. The dielectric layer 10d is formed to cover a portion of the interconnection layer 10r and to expose the other portion of the interconnection layer 10r for electrical connections.

Figure 5B:
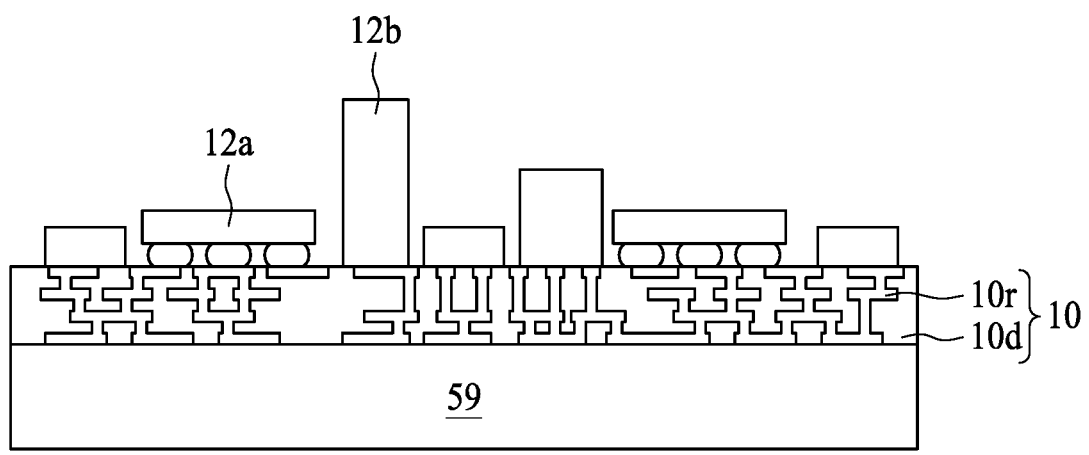

Referring to FIG. 5B, electronic components 12a and 12b are disposed on the carrier 10 and electrically connected to the interconnection layer 10r exposed from the dielectric layer 10d. In some embodiments, the electronic components 12a and 12b are disposed on the carrier 10 by, for example, SMT or any other suitable processes.

Figure 5C:
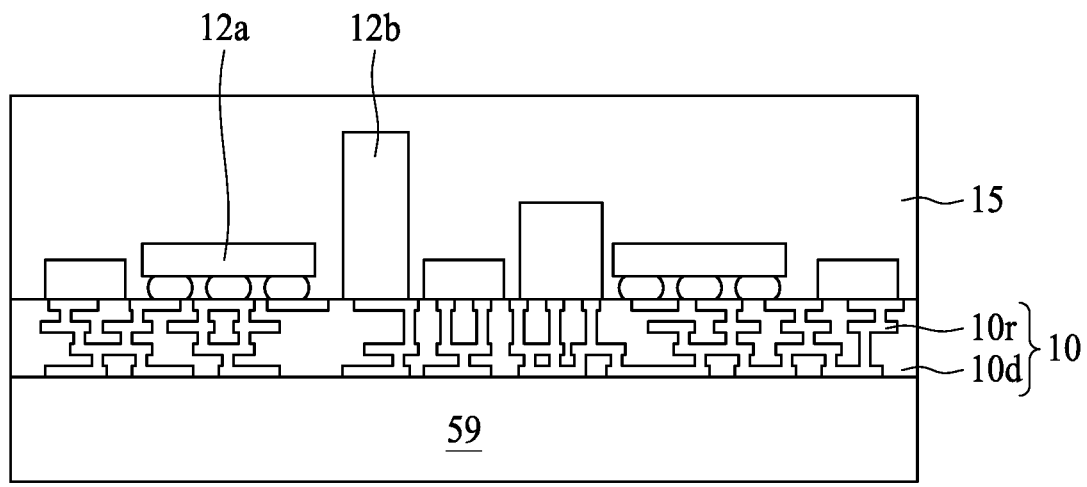

Referring to FIG. 5C, a package body 15 is formed on the carrier 10 to cover the electronic components 12a and 12b. In some embodiments, the package body 15 fully covers the electronic component 12a and 12b. The package body 15 may be formed by, for example, molding or any other suitable processes.

Figure 5D:
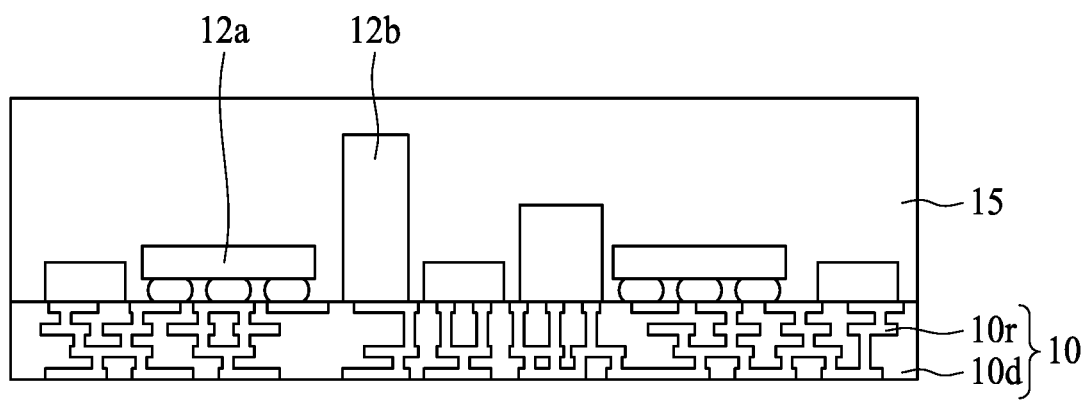

Referring to FIG. 5D, the carrier 59 is removed from the carrier 10 (e.g., de-bonding operation) to expose a surface the carrier 10 facing away from the electronic components 12a and 12b.

Figure 5E:
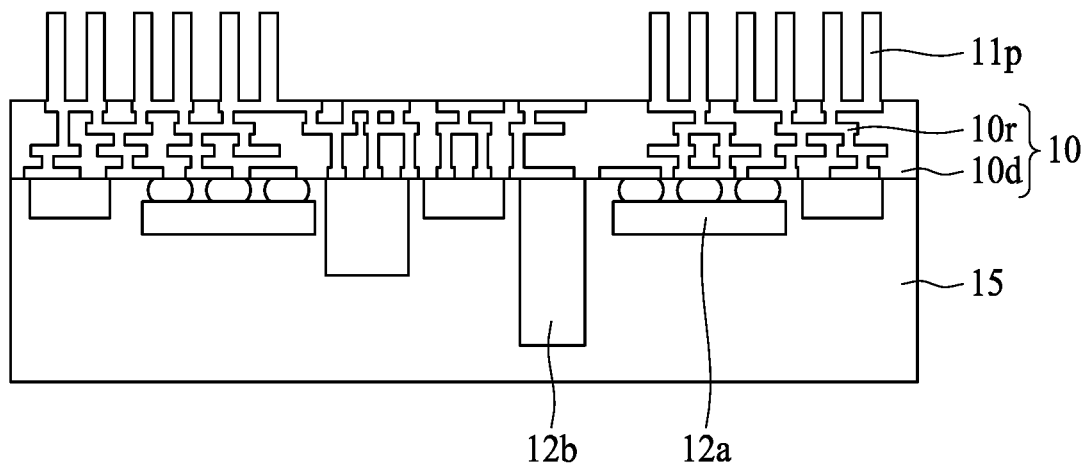

Referring to FIG. 5E, one or more electrical connections (e.g., conductive pillars) 11p are formed on the surface the carrier 10 facing away from the electronic components 12a and 12b. The electrical connections 11p are electrically connected to the interconnection layer 10r exposed from the dielectric layer 10d. In some embodiments, the electrical connections 11p may be formed by, for example, plating or any other suitable processes.

Figure 5F:
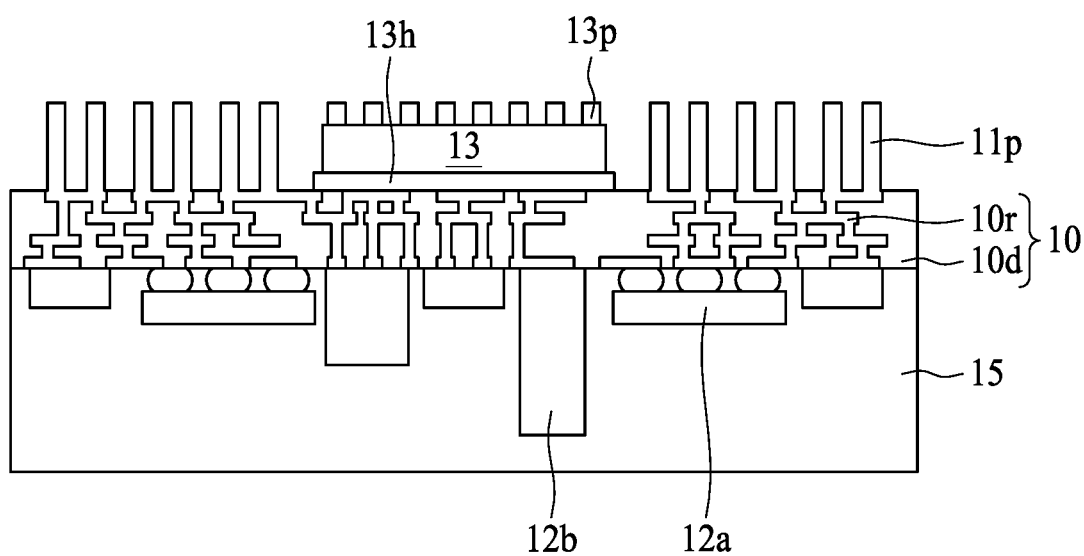

Referring to FIG. 5F, an electronic component 13 is disposed on the carrier 10. For example, a backside surface of the electronic component 13 is connected to the carrier 10 through an adhesive layer 13h (e.g., DAF).

Figure 5G:
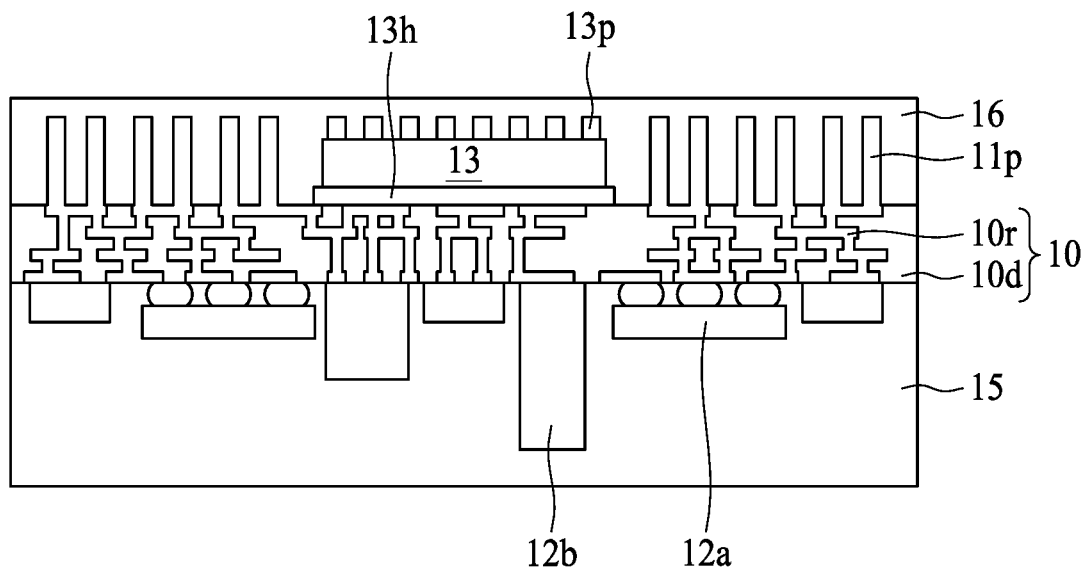

Referring to FIG. 5G, a package body 16 is formed on the carrier 10 to cover the electronic component 13 and the electrical connections 11p. In some embodiments, the package body 16 fully covers the electronic component 13 (including the conductive pillars 13p) and the electrical connections 11p. The package body 16 may be formed by, for example, molding or any other suitable processes.

Figure 5H:
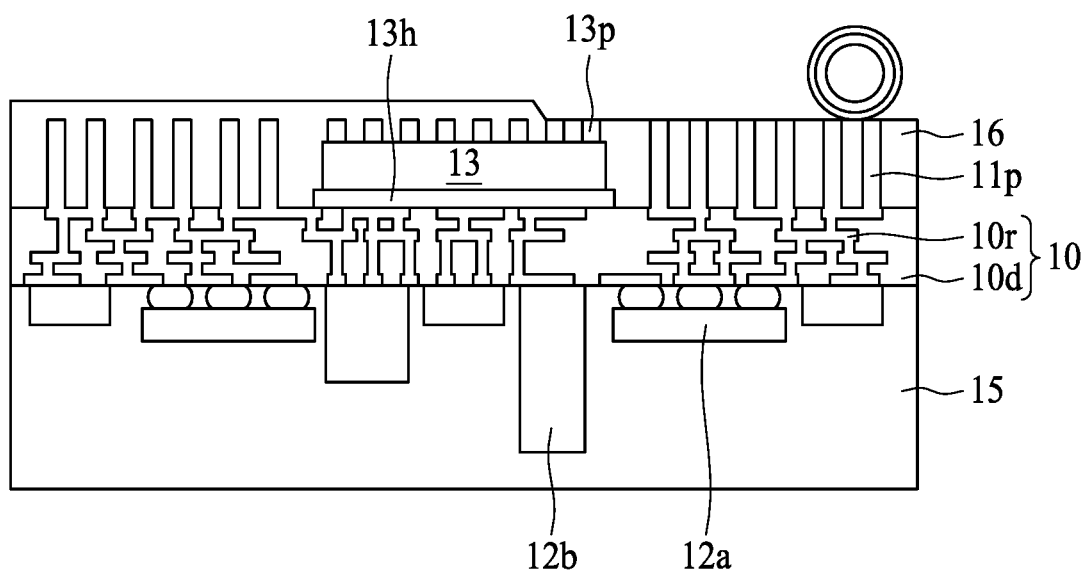

Referring to FIG. 5H, a portion of the package body 16 is removed to expose the electrical connections 11p and the conductive pillars 13p. In some embodiments, the package body 16 is removed by, for example, grinding or any other suitable processes.

Figure 5I:
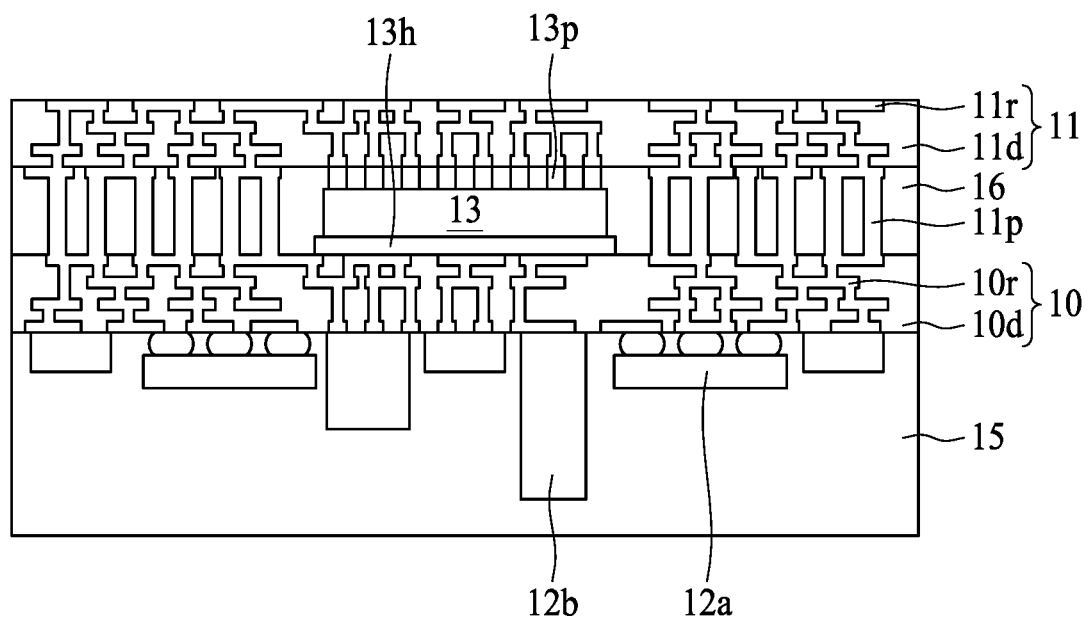

Referring to FIG. 5I, a carrier 11 including an interconnection layer 11r (e.g., RDL) and a dielectric layer 10d is formed on the package body 16. The interconnection layer 11r of the carrier 11 is electrically connected to the electrical connections 11p and the conductive pillars 13p exposed from the package body 16. In some embodiments, the interconnection layer 11r may be formed by, for example, plating or any other suitable processes. The dielectric layer 11d is formed to cover a portion of the interconnection layer 11r and to expose the other portion of the interconnection layer 11r for electrical connections.

Figure 5J:
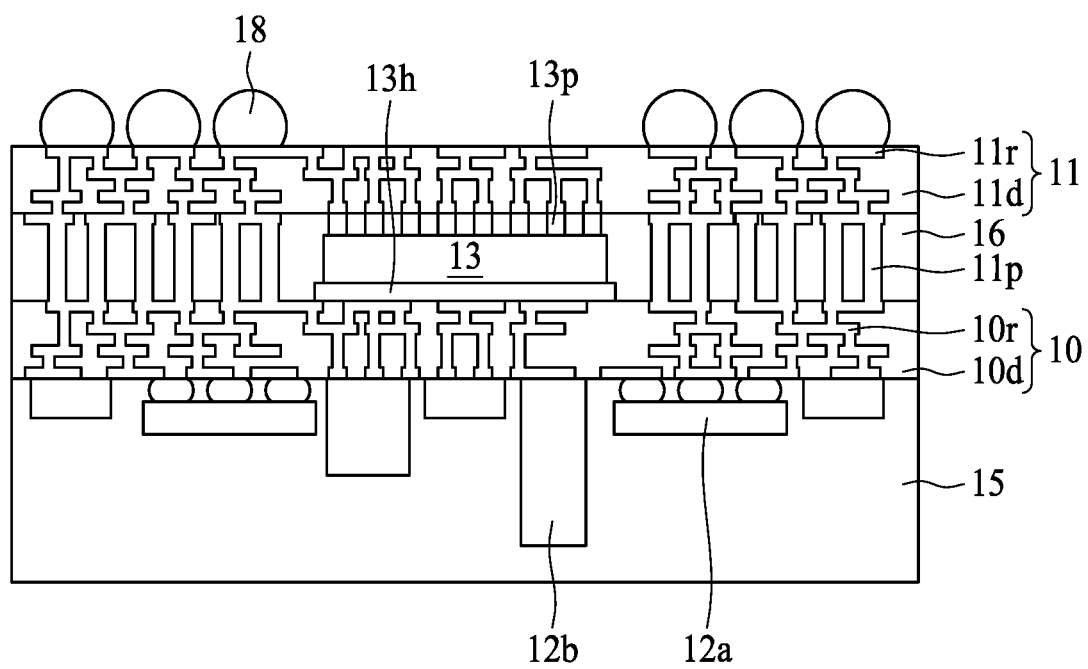

Referring to FIG. 5J, electrical contacts 18 (e.g., solder balls) are formed on the surface of the carrier 11 facing away from the electronic component 13. In some embodiments, a singulation may be performed by, for example, sawing or any other suitable processes.

Then, a shield 17 is formed on external surfaces of the package body 15 (e.g., a top surface and a lateral surface), the lateral surface of the carrier 10, the lateral surface of the package body 16 and a portion of the lateral surface of the carrier 11 to form the semiconductor device package 2 as shown in FIG. 2 In some embodiments, the shield 17 is formed by, for example, sputtering (e.g., selective sputtering).

In some embodiments, the cost of the electronic component 13 is much higher than the cost of the electronic components 12a and 12b. In accordance with the embodiments as shown in FIG. 5A to FIG. 5J, the electronic component 13 is disposed on the carrier 10 after the electronic components 12a and 12b are disposed on the carrier 10. Therefore, a test may be carried out to the electronic components 12a and 12b, and then the electronic component 13 is disposed on the carrier 10 if the electronic components 12a and 12b pass the test. This would increase the yield rate of the semiconductor device package and significantly reduce the manufacturing cost.

FIG. 6A, FIG. 6B, FIG. 6C, FIG. 6D, FIG. 6E, FIG. 6F, FIG. 6G, FIG. 6H, FIG. 6I and FIG. 6J illustrate a semiconductor manufacturing method in accordance with some embodiments of the present disclosure. In some embodiments, the method in FIG. 6A, FIG. 6B, FIG. 6C, FIG. 6D, FIG. 6E, FIG. 6F, FIG. 6G, FIG. 6H, FIG. 6I and FIG. 6J can be used to manufacture the semiconductor device package 3A in FIG. 3A. The operations illustrated in FIGS. 6A-6J are similar to the operations illustrated in FIGS. 4A-4J, and the differences therebetween are described below.

Figure 6A:
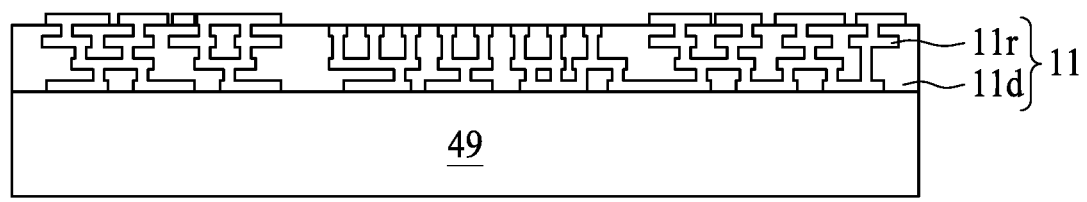
FIG. 6A, FIG. 6B, FIG. 6C, FIG. 6D, FIG. 6E, FIG. 6F, FIG. 6G, FIG. 6H, FIG. 6I and FIG. 6J illustrate a semiconductor manufacturing method in accordance with some embodiments of the present disclosure.
Figure 6B:
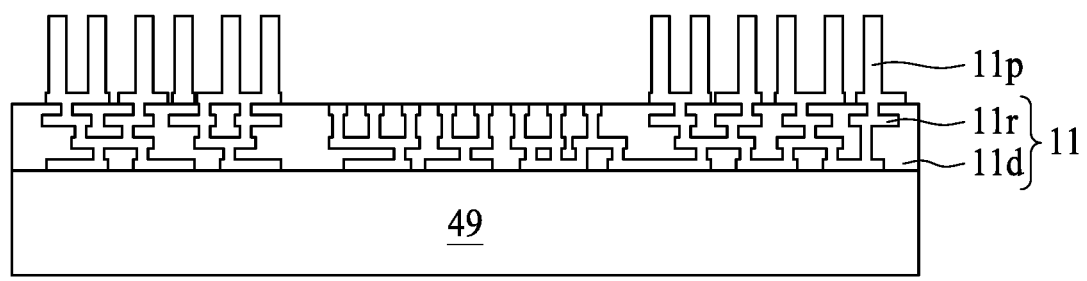
Figure 6C:
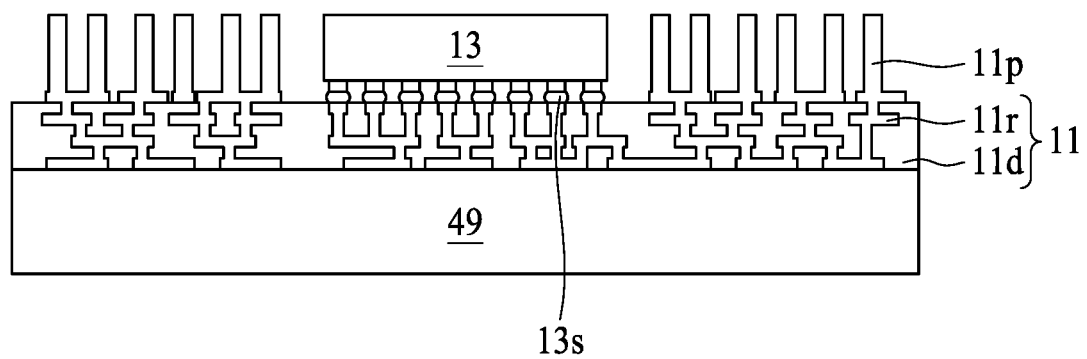
Figure 6D:
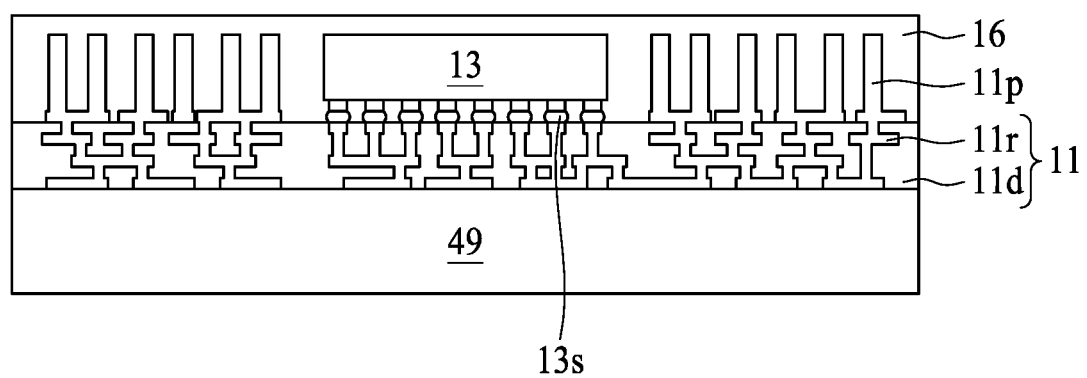

Referring to FIG. 6C, the electronic component 13 is disposed on the carrier 11 by, for example, flip-chip technique. For example, the active surface of the electronic component 13 is electrically connected to the carrier 11 (e.g., to the interconnection layer 11 of the carrier 11) through solder balls 13s.

Figure 6E:
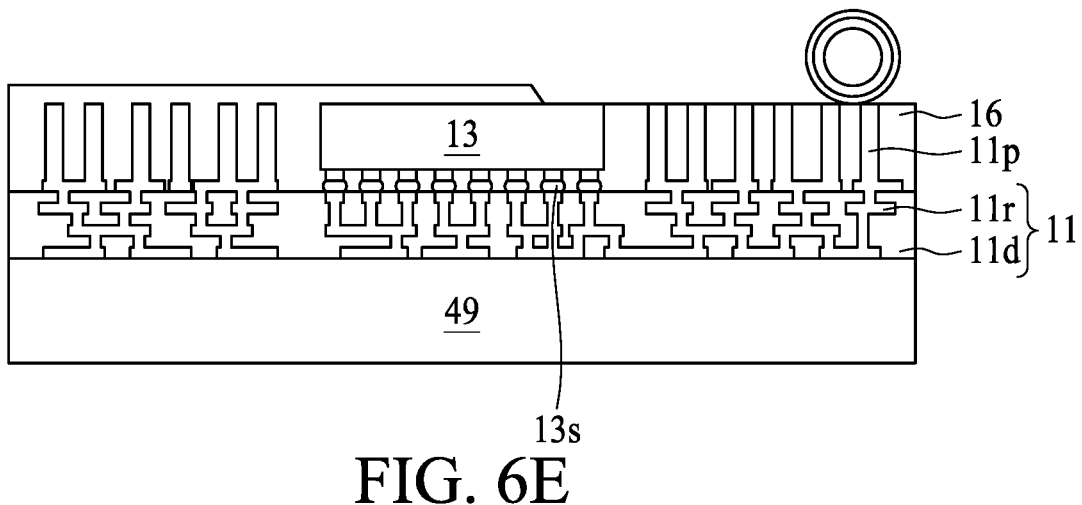
Figure 6F:
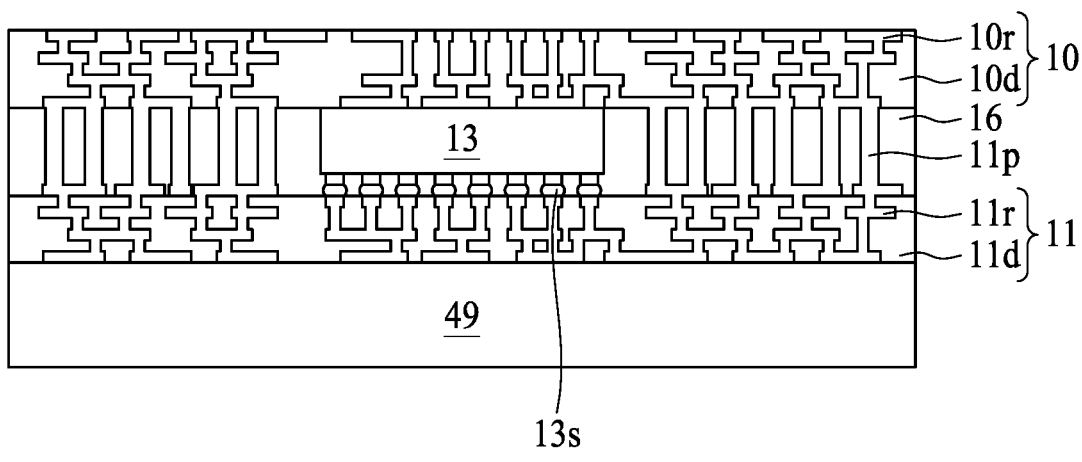
Figure 6G:
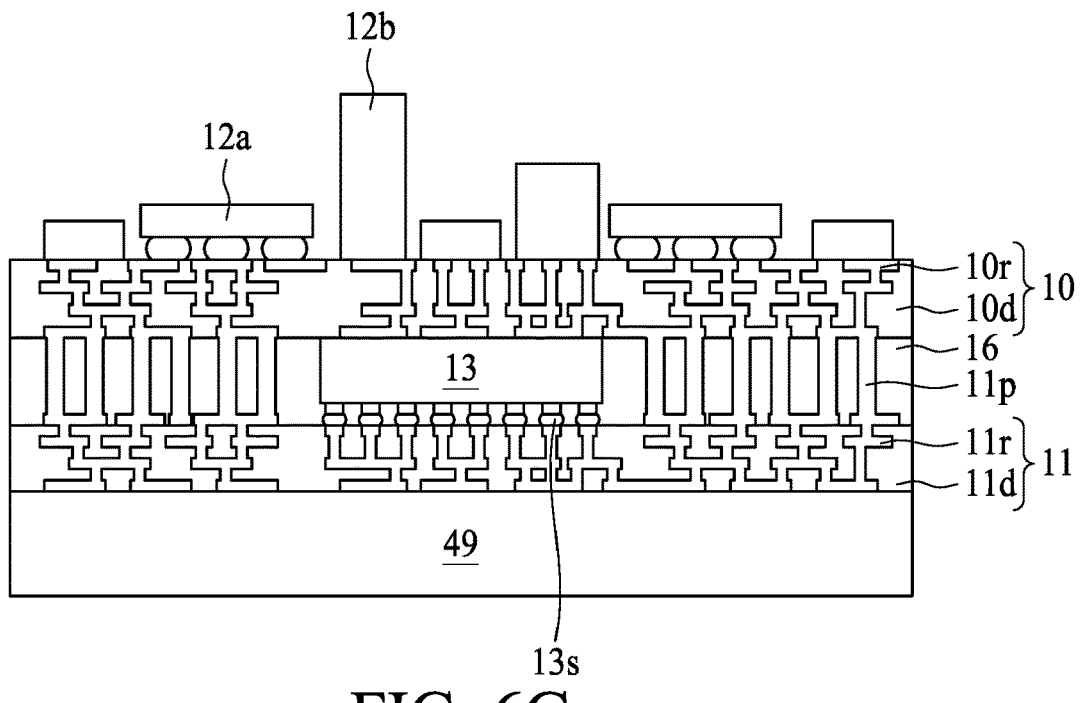
Figure 6H:
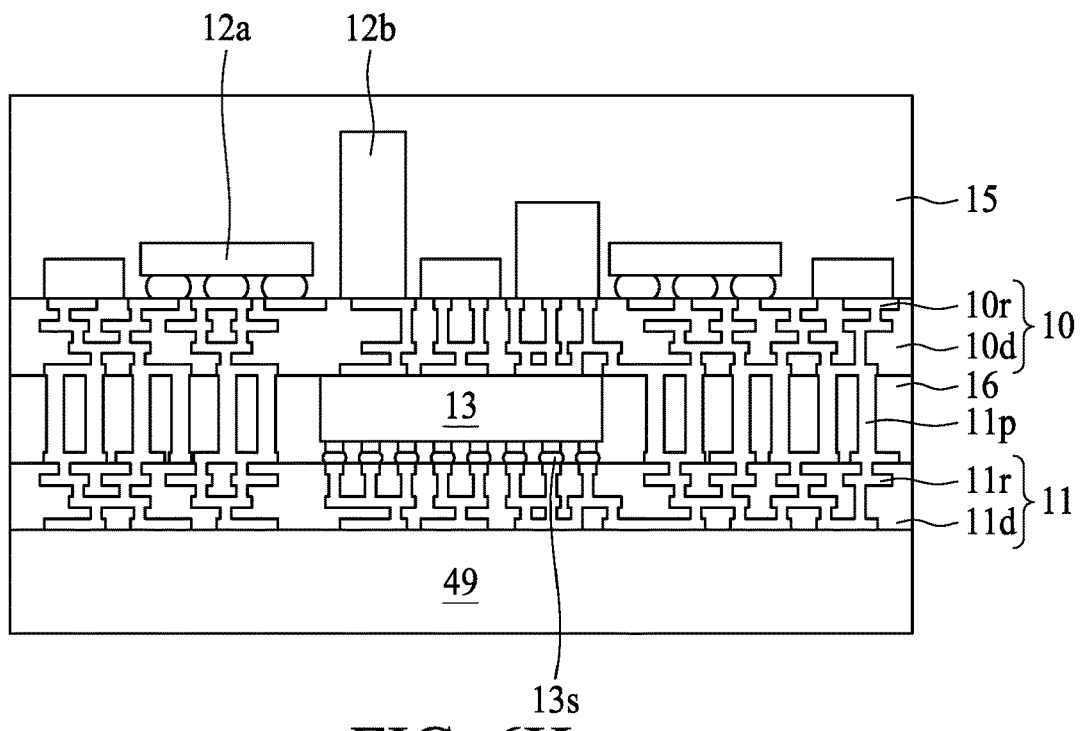
Figure 6I:
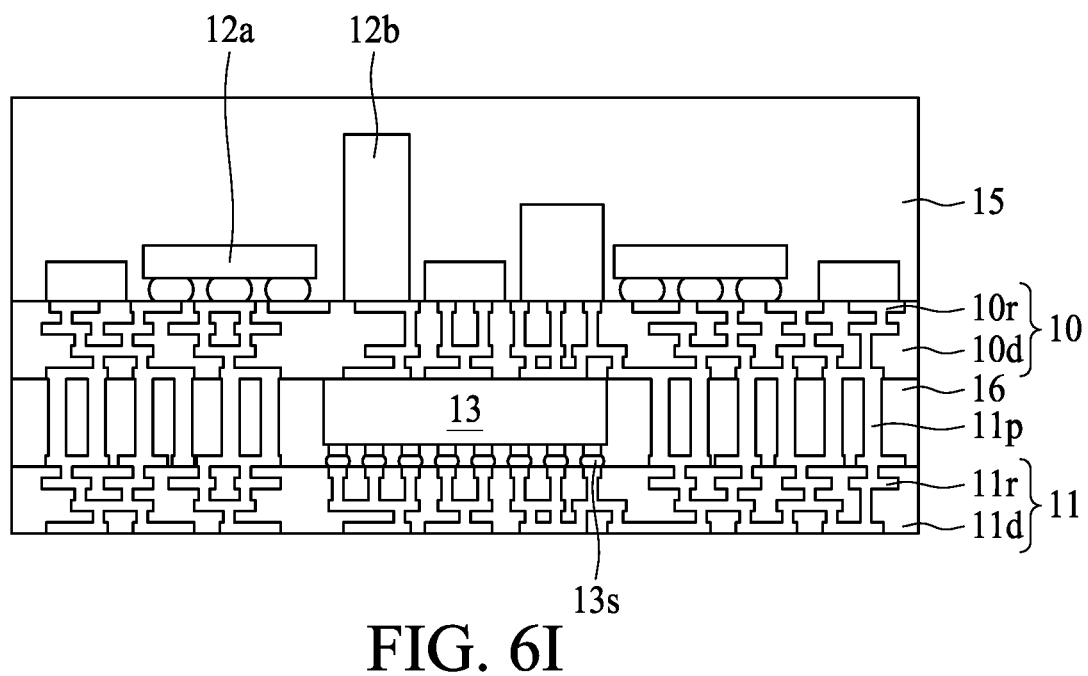
Figure 6J:
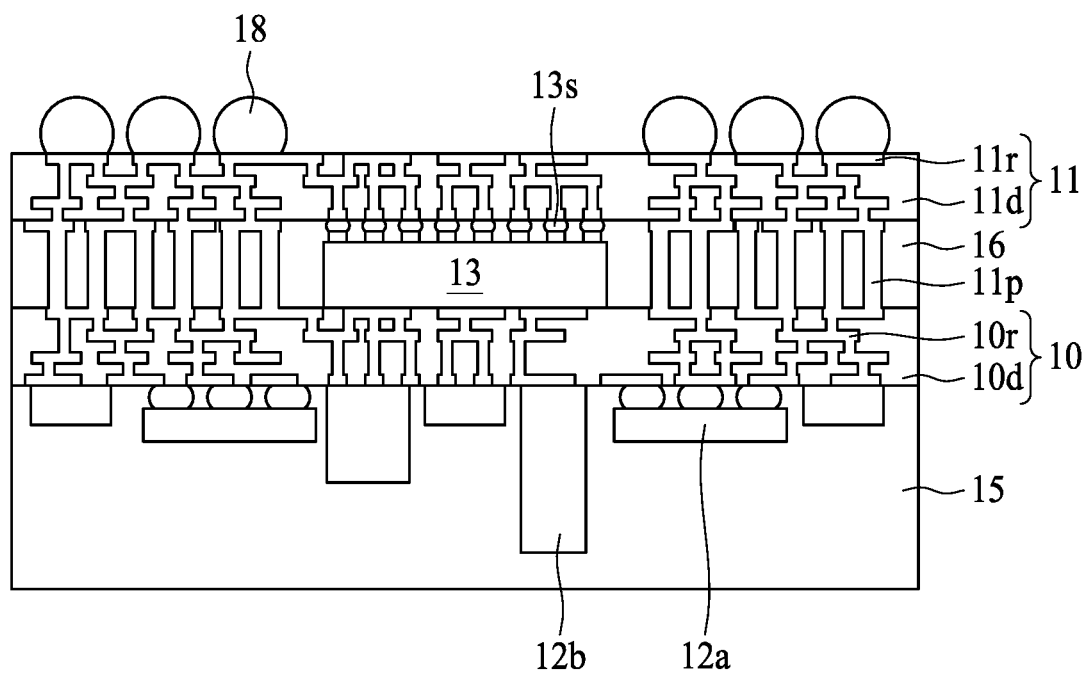

Referring to FIG. 6E, a portion of the package body 16 is removed to expose the electrical connections 11p. In some embodiments, the backside surface of the electronic component 13 is fully covered by the package body 16. Alternatively, the backside surface of the electronic component 13 is exposed from the package body 16.

FIG. 7A, FIG. 7B, FIG. 7C, FIG. 7D, FIG. 7E, FIG. 7F, FIG. 7G, FIG. 7H, FIG. 7I and FIG. 7J illustrate a semiconductor manufacturing method in accordance with some embodiments of the present disclosure. In some embodiments, the method in FIG. 7A, FIG. 7B, FIG. 7C, FIG. 7D, FIG. 7E, FIG. 7F, FIG. 7G, FIG. 7H, FIG. 7I and FIG. 7J can be used to manufacture the semiconductor device package 3B in FIG. 3B. The operations illustrated in FIGS. 7A-7J are similar to the operations illustrated in FIGS. 5A-5J, and the differences therebetween are described below.

Figure 7A:
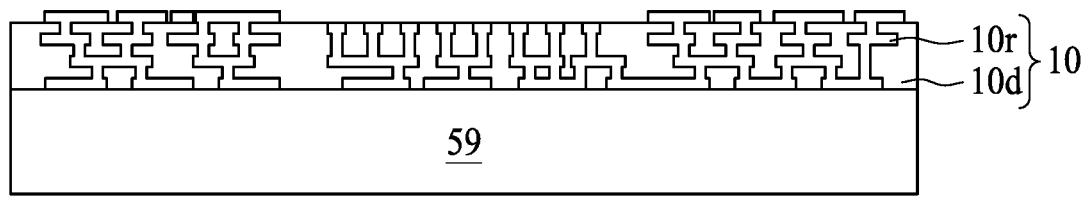
FIG. 7A, FIG. 7B, FIG. 7C, FIG. 7D, FIG. 7E, FIG. 7F, FIG. 7G, FIG. 7H, FIG. 7I and FIG. 7J illustrate a semiconductor manufacturing method in accordance with some embodiments of the present disclosure.
Figure 7B:
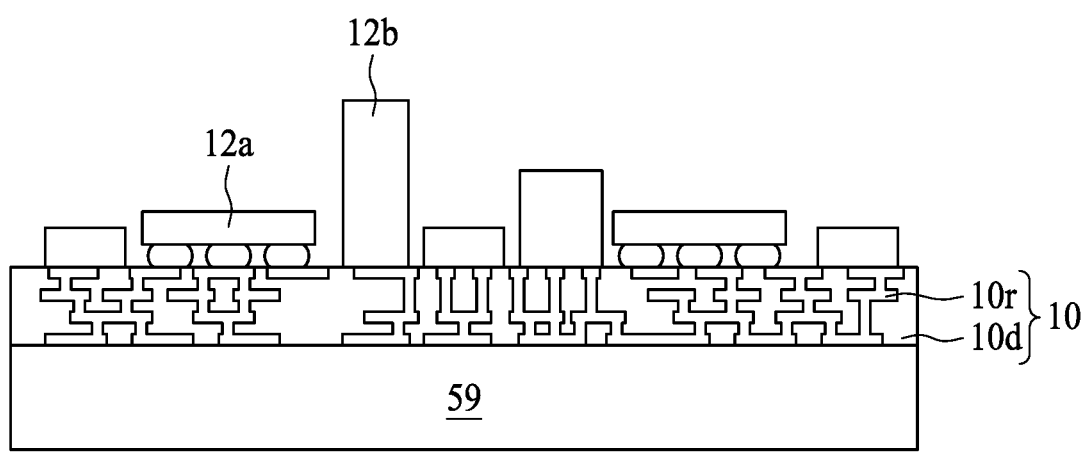
Figure 7C:
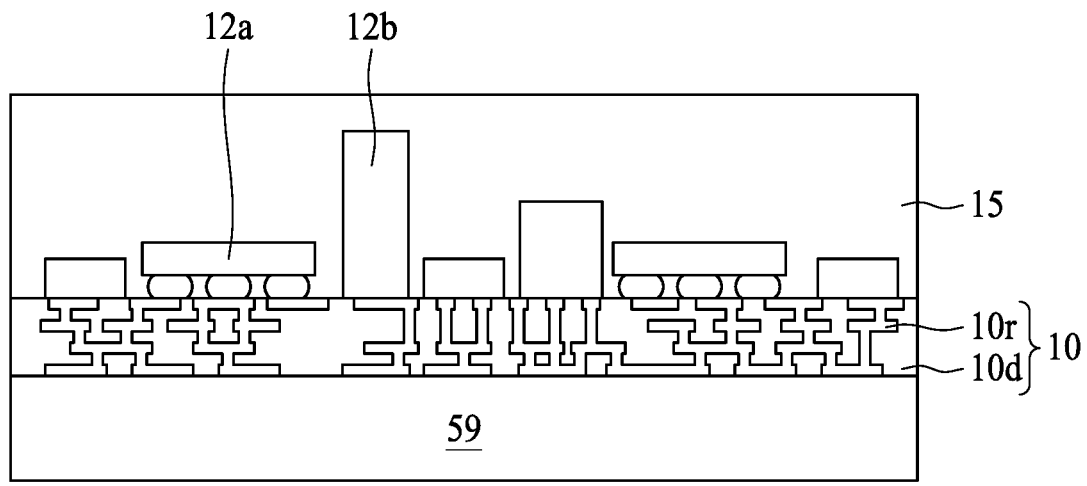
Figure 7D:
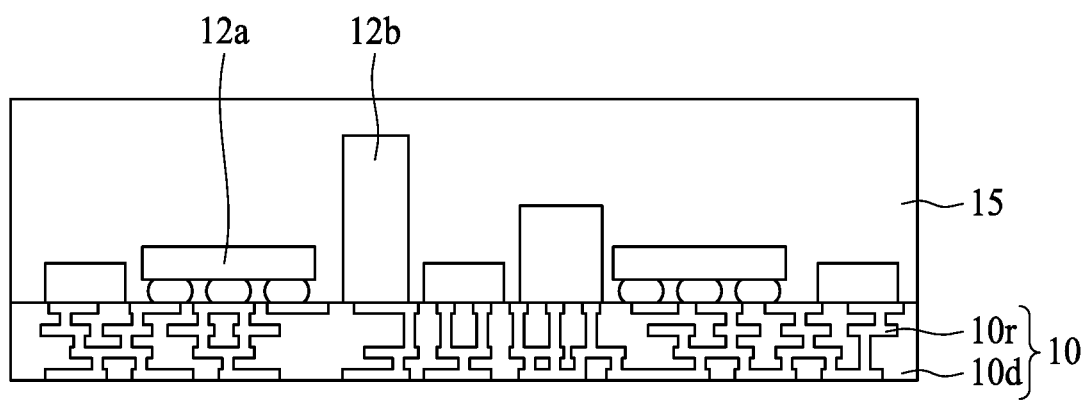
Figure 7E:
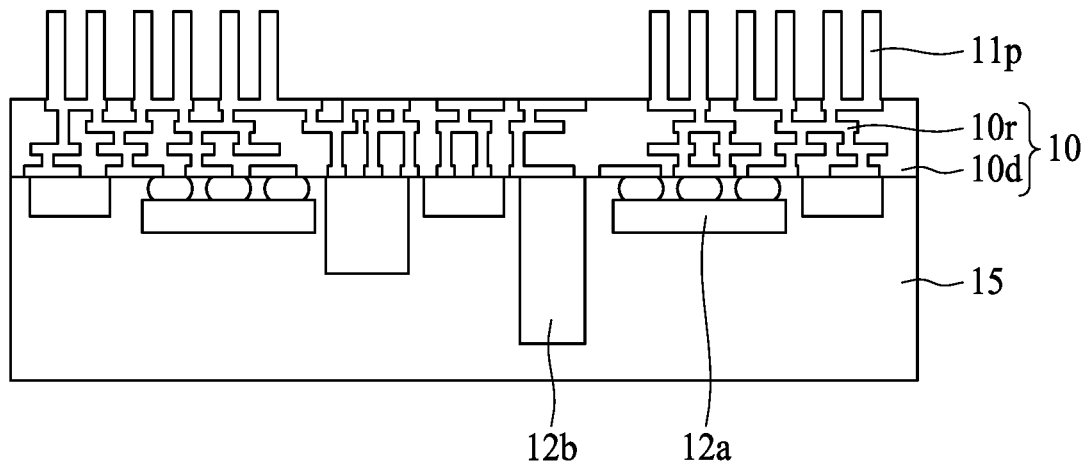
Figure 7F:
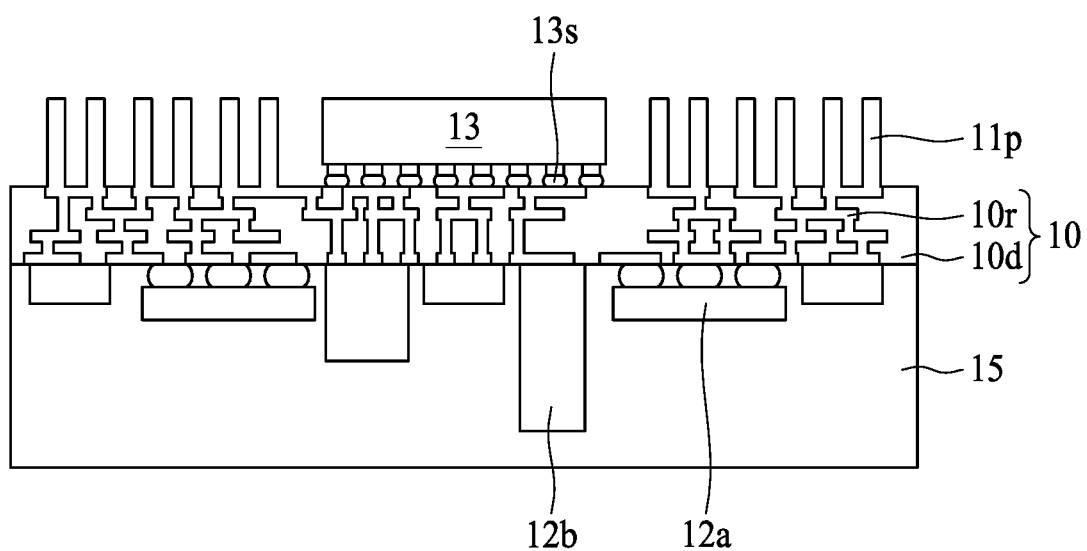
Figure 7G:
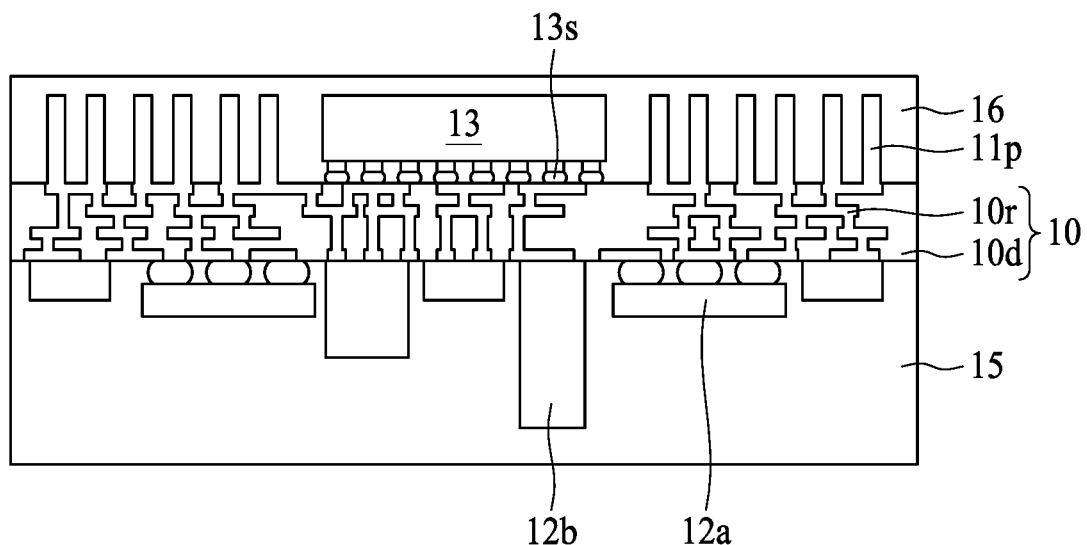

Referring to FIG. 7F, the electronic component 13 is disposed on the carrier 10 by, for example, flip-chip technique. For example, the active surface of the electronic component 13 is electrically connected to the carrier 10 (e.g., to the interconnection layer 10 of the carrier 10) through solder balls 13s.

Figure 7H:
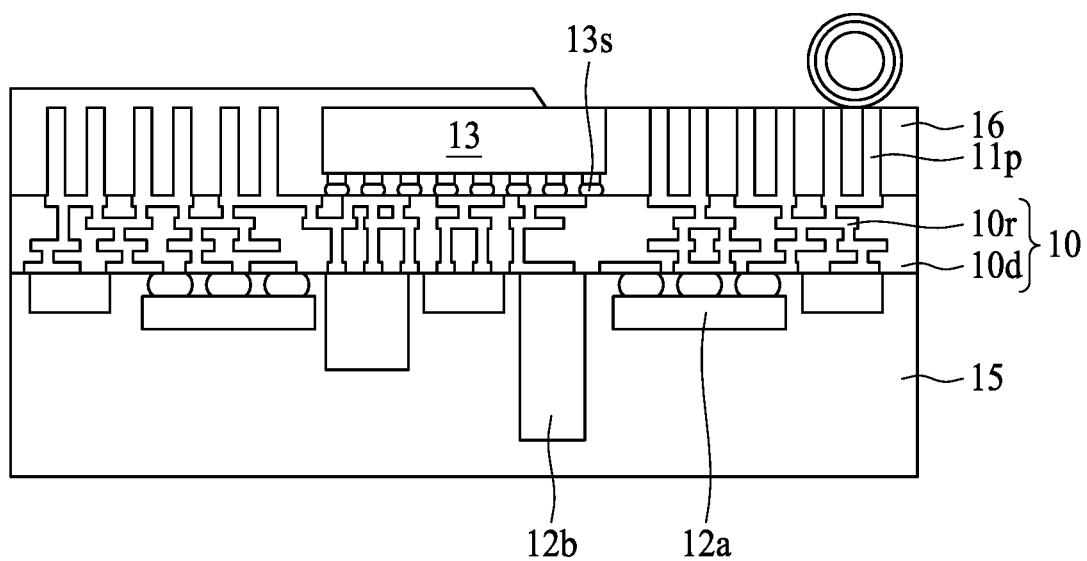
Figure 7I:
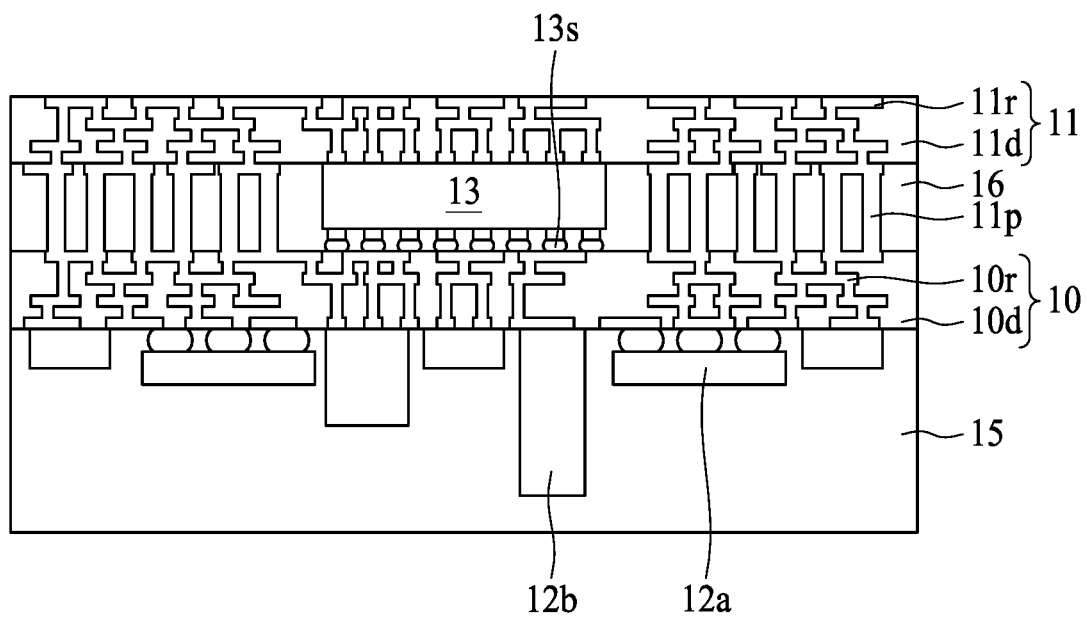
Figure 7J:
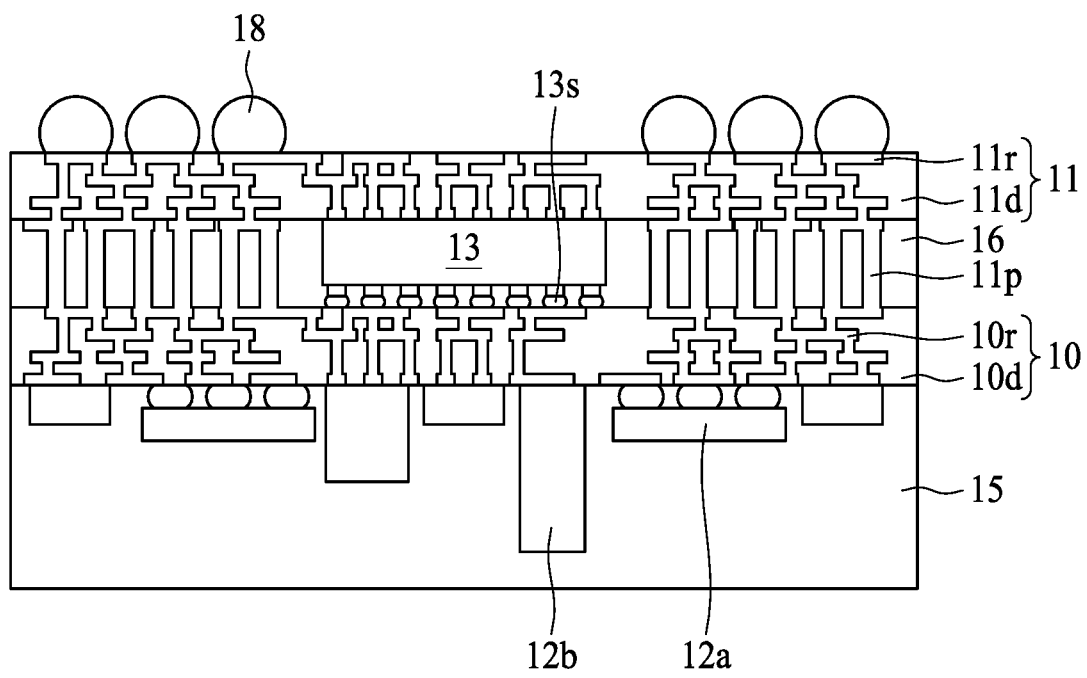

Referring to FIG. 7H, a portion of the package body 16 is removed to expose the electrical connections 11p. In some embodiments, the backside surface of the electronic component 13 is fully covered by the package body 16. Alternatively, the backside surface of the electronic component 13 is exposed from the package body 16.

Figure 8A:
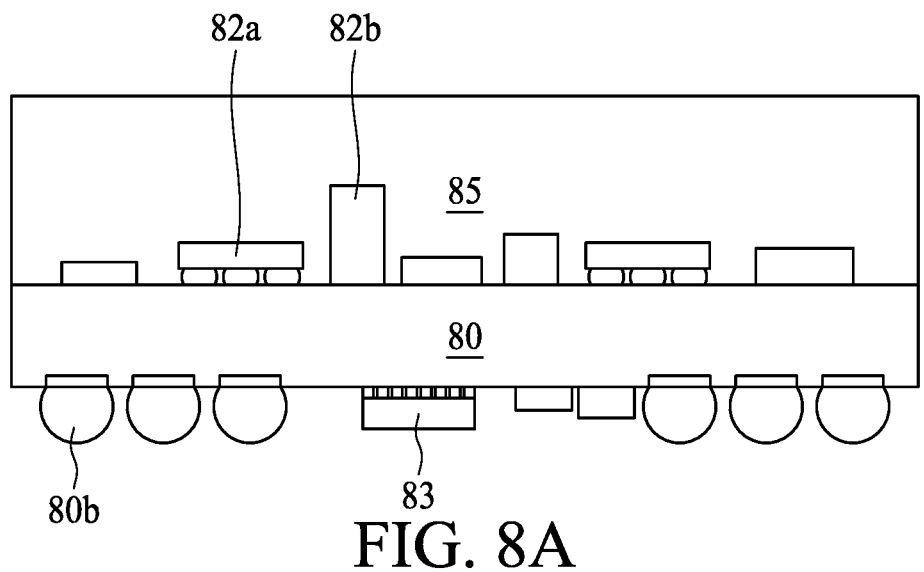
FIG. 8A, FIG. 8B, FIG. 8C, FIG. 8D, FIG. 8E, FIG. 8E', FIG. 8F and FIG. 8F' illustrate a semiconductor manufacturing method in accordance with some embodiments of the present disclosure.
Figure 8B:
Figure 8C:
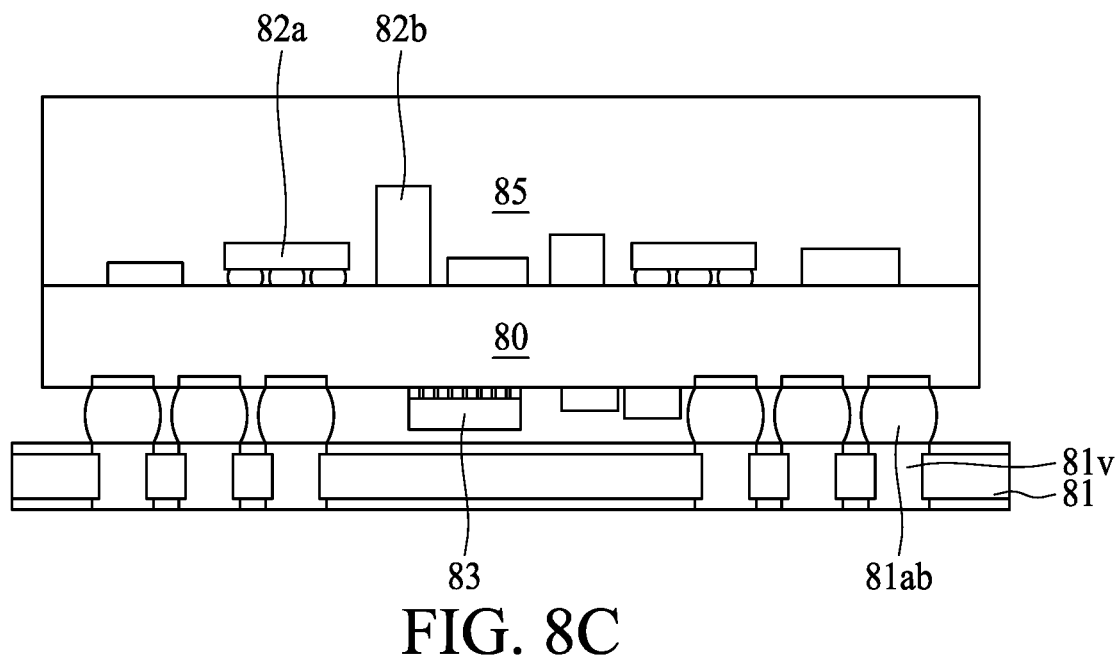
Figure 8D:
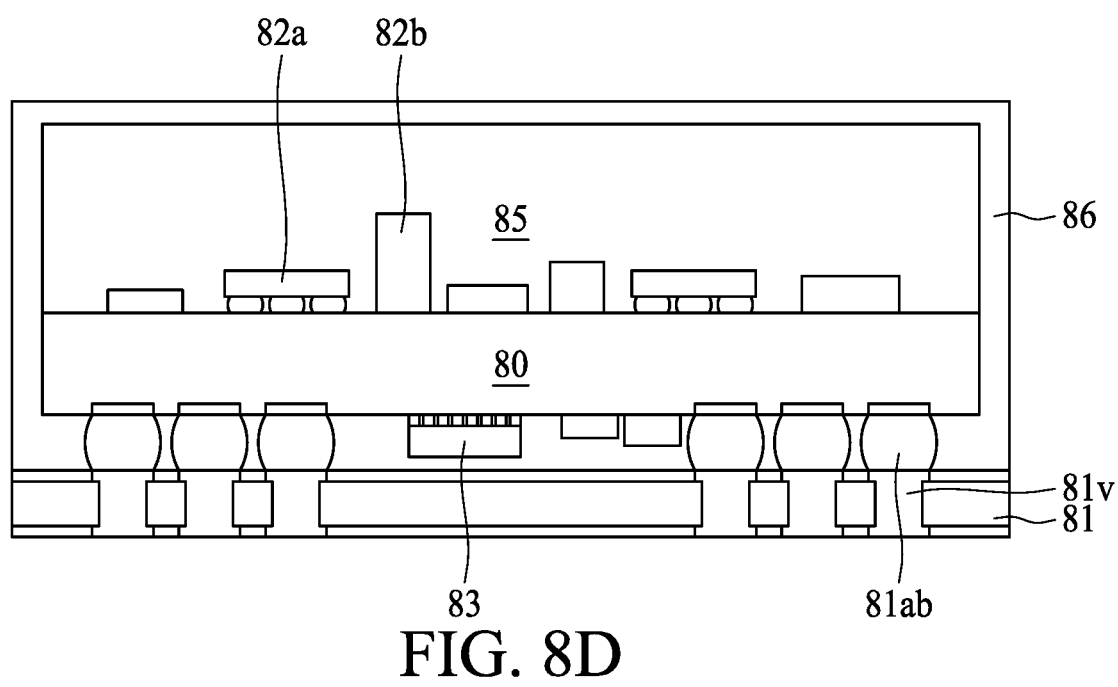
Figure 8E:
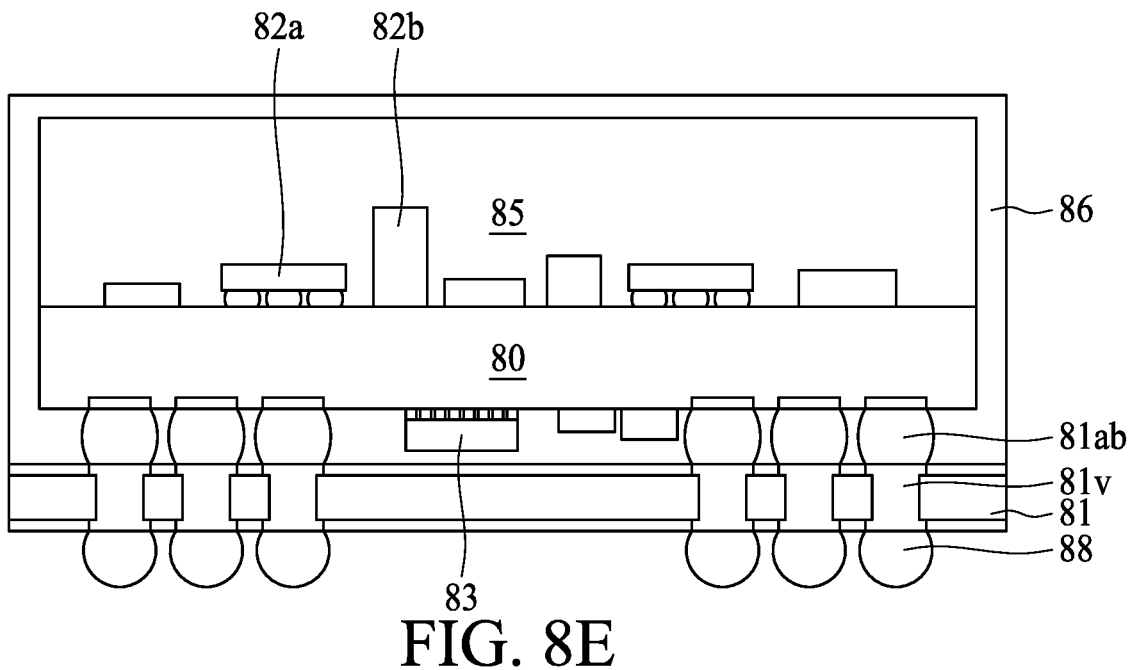
Figure 8E:
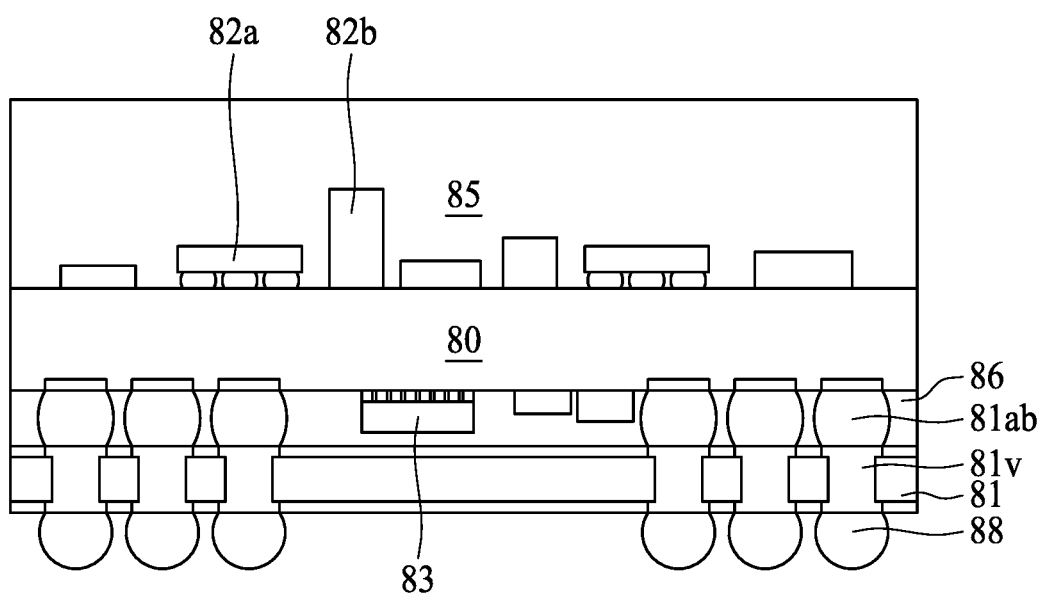
Figure 8F:
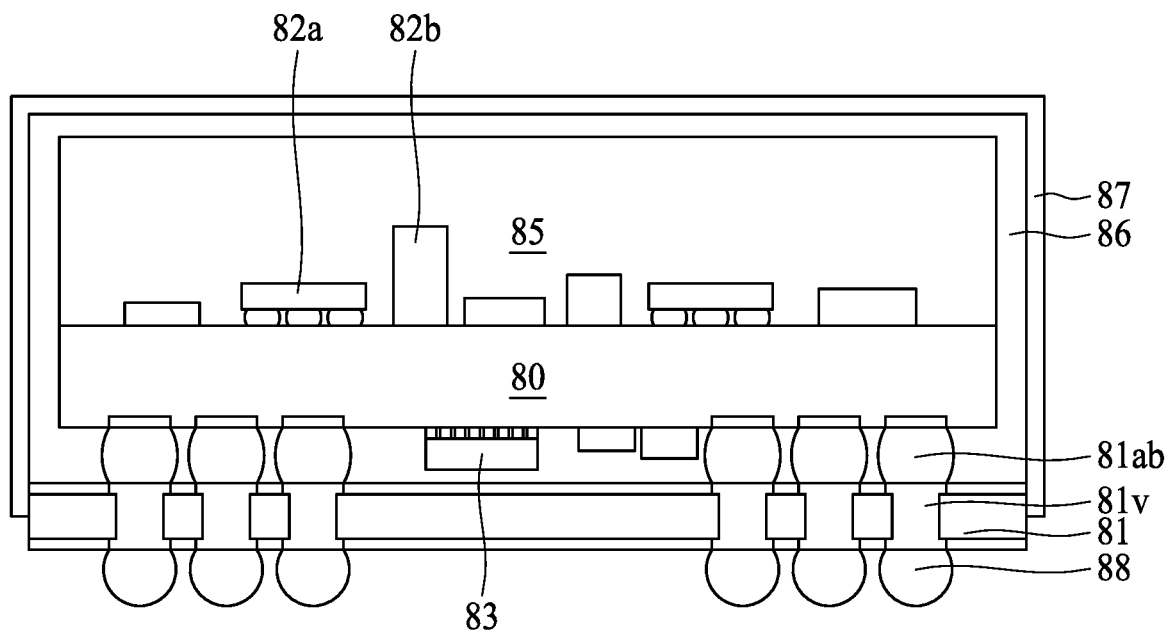
Figure 8F:
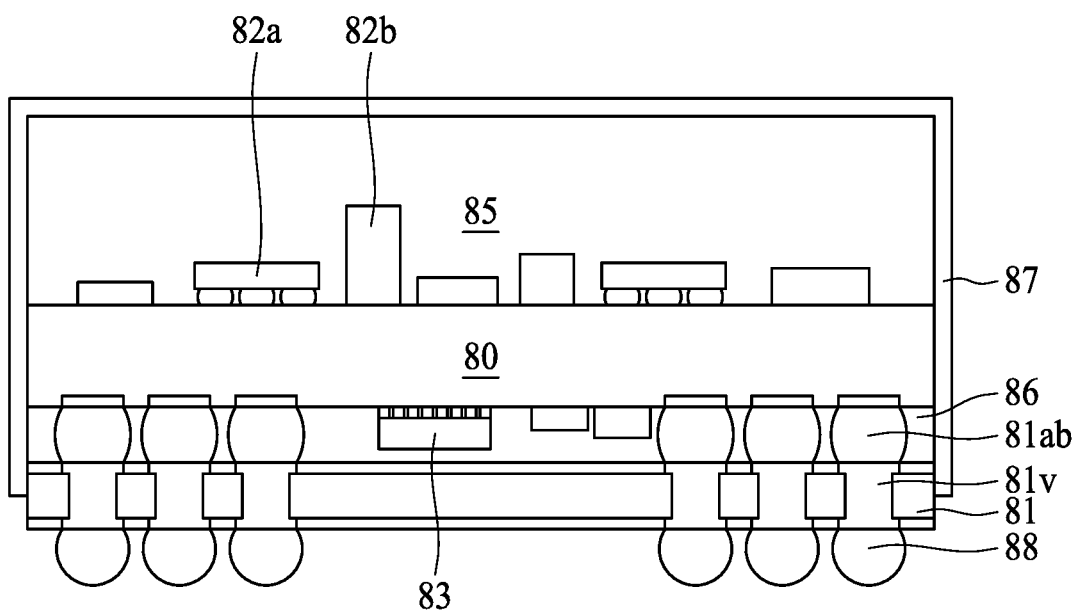

FIG. 8A, FIG. 8B, FIG. 8C, FIG. 8D, FIG. 8E, FIG. 8E', FIG. 8F and FIG. 8F' illustrate a semiconductor manufacturing method in accordance with some embodiments of the present disclosure.

Referring to FIG. 8A, a semiconductor device package is provided. The semiconductor device package includes a substrate 80, electronic components 82a, 82b, 83 and a package body 85. The substrate may be a PCB, such as a paper-based copper foil laminate, a composite copper foil laminate, a polymer-impregnated glass-fiber-based copper foil laminate, or a combination of two or more thereof. In some embodiments, the substrate 10 is or includes a multi-layer substrate. The electronic components 82a, 82b, 83 and the package body 85 are respectively similar to the electronic components 12a, 12b, 13 and the package body 15 of the semiconductor device package 1 as shown in FIG. 1, and the descriptions for the electronic components 12a, 12b, 13 and the package body 15 may be applicable to the electronic components 82a, 82b, 83 and the package body 85. Electrical contacts 80b (e.g., solder balls) are disposed on a surface of the substrate 80 facing away from the package body 85.

Referring to FIG. 8B, a strip of FPC boards, including a FPC board 81 is provided. Electrical contacts 81b (e.g., solder balls) are disposed on a surface of the FPC board 81. The FPC board 81 has one or more through vias 81v penetrating the FPC board 81 board and electrically connected to the electrical contacts 81b.

Referring to FIG. 8C, the semiconductor device package as shown in FIG. 8A is disposed on the strip of FPC boards including the FPC board 81 by, for example, SMT technique. The electrical contacts 80b are electrically connected to the corresponding electrical contacts 81b. In some embodiments, a reflow operation may be carried out, and the electrical contacts 80b and 81b form electrical contacts Blab.

Referring to FIG. 8D, a package body 86 is formed on the strip of FPC boards including the FPC board 81 to cover the semiconductor device package as shown in FIG. 8A and the electrical contacts 81ab. The package body 86 may be formed by, for example, molding or any other suitable processes. In some embodiments, the package body 86 and the package body 85 include the same material. Alternatively, the package body 86 and the package body 85 include different materials.

Referring to FIG. 8E, electrical contacts 88 are disposed on a surface of the FPC board 81 facing away the electrical contacts 81ab. Then, a singulation operation is carried out to separate out individual semiconductor package devices. That is, the singulation is performed through the package body 86 and the strip of FPC boards including the PFC board 81. The singulation may be performed, for example, by using a dicing saw, laser or other appropriate cutting technique. In some embodiments, a lateral surface of the substrate 80 and a lateral surface of the package body 85 are covered by the package body 86 after the singulation operation. For example, the lateral surface of the substrate 80 and the lateral surface of the package body 85 are recessed from a lateral surface of the FPC board 81. In other embodiments, as shown in FIG. 8E', the lateral surfaces of the package body 85, the substrate 80, the package body 86 and the FPC board 81 are coplanar after the singulation operation. For example, the lateral surfaces of the package body 85 and the substrate 80 are not covered (or exposed from) the package body 86.

Referring to FIG. 8F, after the operation illustrated in FIG. 8E, a shield 87 is formed to cover the external surfaces (including a top surface and a lateral surface) of the package body 86. The shield 87 may also cover a portion of the lateral surface of the FPC board 81 and expose the other portion of the lateral surface of the FPC board 81. In some embodiments, the shield 87 may be formed by, for example, sputtering or any other suitable processes.

Referring to FIG. 8F', after the operation illustrated in FIG. 8E', a shield 87 is formed to cover the lateral surfaces of the package body 85, the substrate 80 and the package body 86. The shield 87 may also cover a portion of the lateral surface of the FPC board 81 and expose the other portion of the lateral surface of the FPC board 81. In some embodiments, the shield 87 may be formed by, for example, sputtering or any other suitable processes.

Figure 9A:
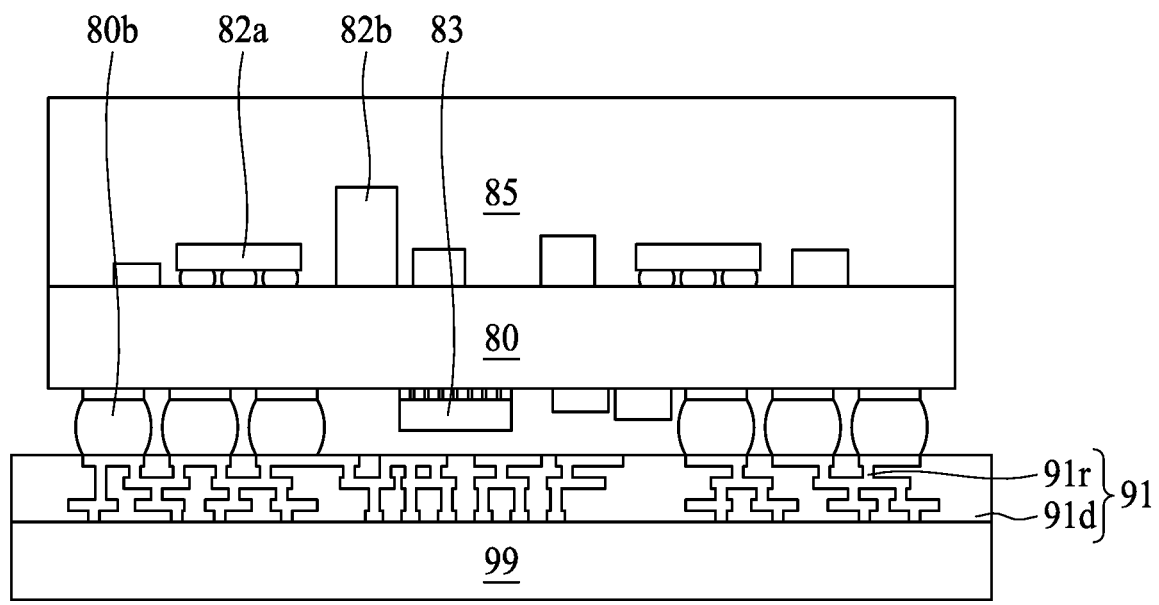
FIG. 9A, FIG. 9B, FIG. 9C and FIG. 9D illustrate a semiconductor manufacturing method in accordance with some embodiments of the present disclosure.
Figure 9B:
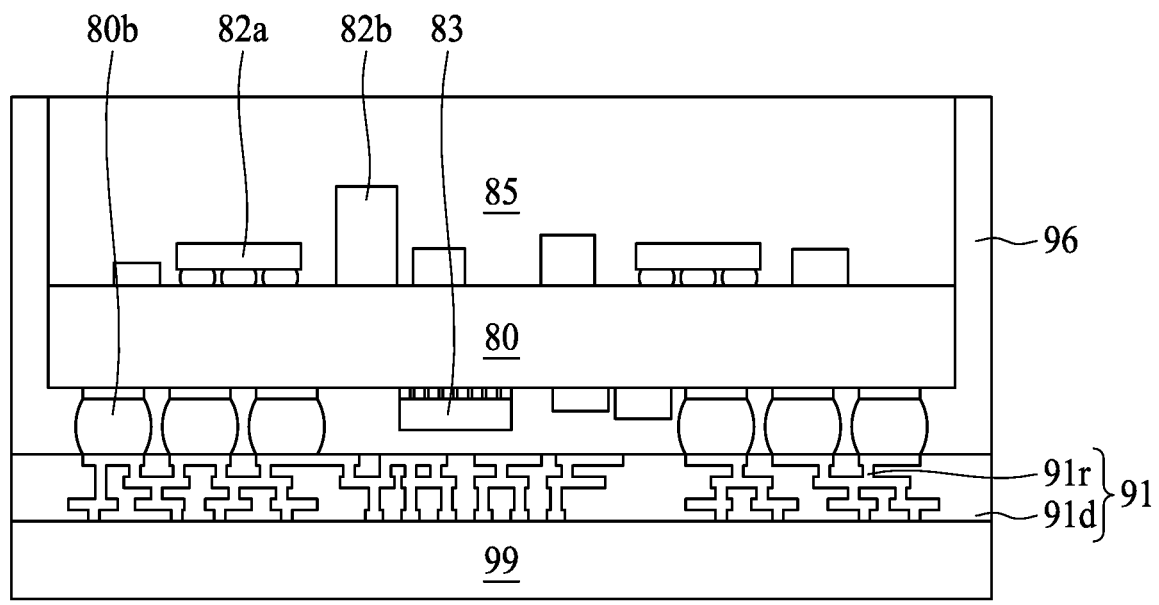
Figure 9C:
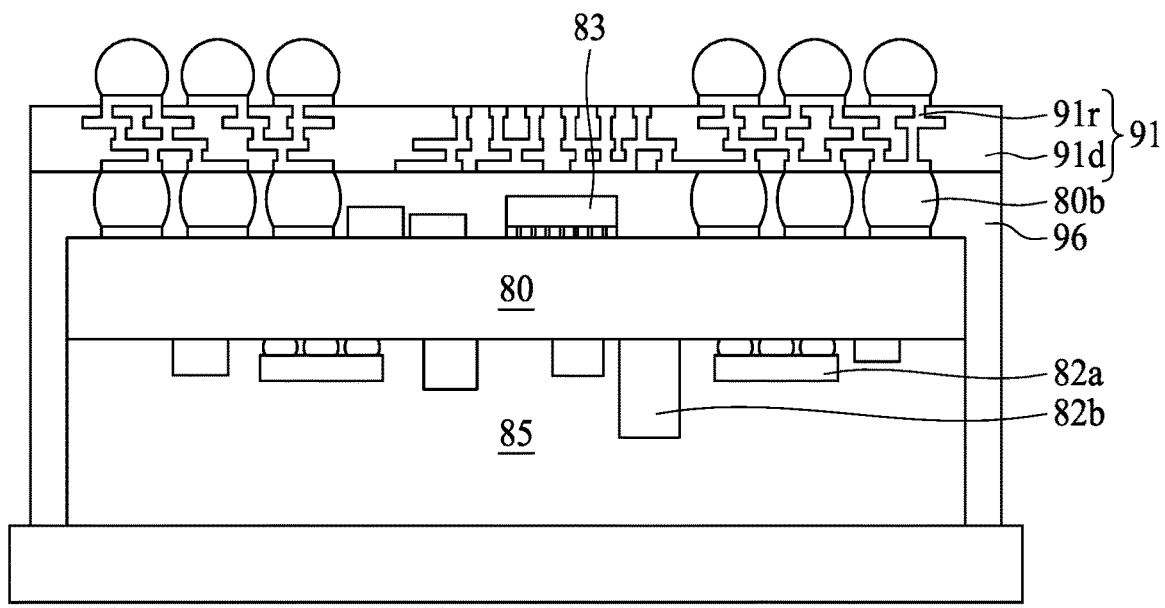

FIG. 9A, FIG. 9B, FIG. 9C and FIG. 9D illustrate a semiconductor manufacturing method in accordance with some embodiments of the present disclosure. The operations illustrated in FIG. 9A, FIG. 9B and FIG. 9C are similar to those illustrated in FIG. 8A, FIG. 8B, FIG. 8C, FIG. 8D, FIG. 8E, FIG. 8E', FIG. 8F and FIG. 8F', except that in FIG. 8C, the semiconductor device package as shown in FIG. 8A is disposed on a strip of FPC boards while in FIG. 9A, the semiconductor device package as shown in FIG. 8A is disposed on a plurality of circuit layers (e.g., a wafer) including a circuit layer 91. The circuit layer 91 (including a RDL 91r and a dielectric layer 91d) is similar to the circuit layer 11 as shown in FIG. 1, and the descriptions for the circuit layer 11 are applicable to the circuit layer 91.

Figure 9D:
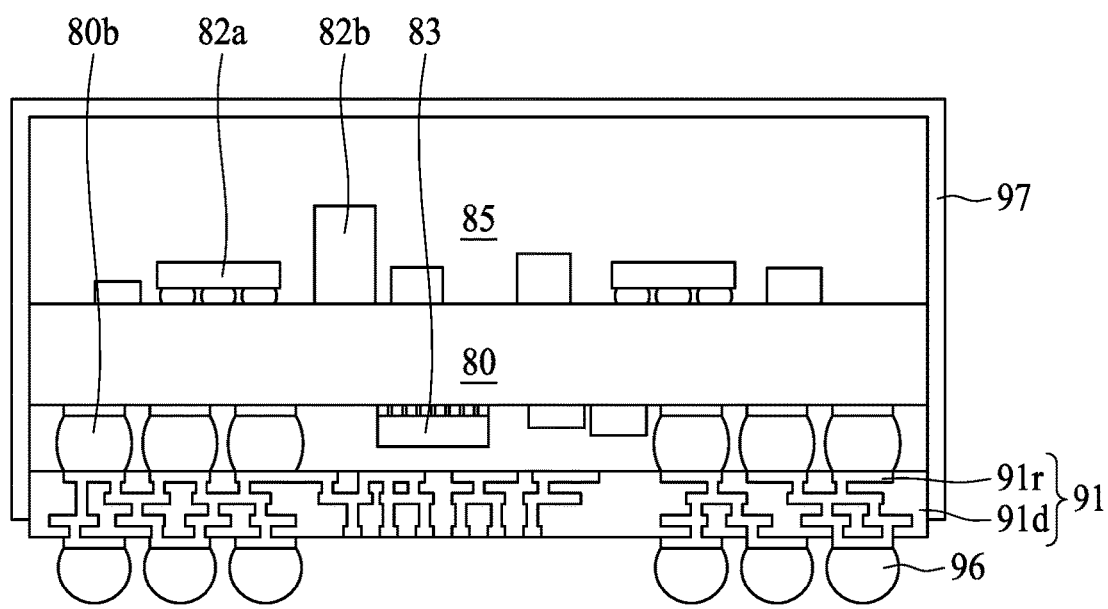

Referring to FIG. 9D, a shield 97 is formed to cover the lateral surfaces of the package body 85, the substrate 80 and a package body 96. The shield 97 may also cover a portion of the lateral surface of the circuit layer 91 and expose the other portion of the lateral surface of the circuit layer 91. In some embodiments, the shield 97 may be formed by, for example, sputtering or any other suitable processes.

In other embodiments, similar to the operations illustrated in FIG. 8E and FIG. 8F, the package body 96 may cover the lateral surface of the substrate 80 and the lateral surface of the package body 85 after the singulation operation. Hence, the shield 97 is formed to cover the external surfaces (including a top surface and a lateral surface) of the package body 86.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
    a first carrier including an interconnection layer and a dielectric layer encapsulating a portion of the interconnection layer, the first carrier having a first surface, a second surface opposite to the first surface and a lateral surface extending between the first surface and the second surface;
    a first electronic component disposed on the first surface of the first carrier;
    a second electronic component disposed on the second surface of the first carrier;
    a second carrier facing the second surface of the first carrier, the second carrier including an interconnection layer and a dielectric layer encapsulating a portion of the interconnection layer, the second carrier having a surface and a lateral surface angled to the surface of the second carrier;
    an electrical connection structure electrically connecting the first carrier with the second carrier; and
    a first package body encapsulating the second electronic component, the electrical connection structure and the lateral surface of the second carrier,
    wherein the lateral surface of the first carrier and the lateral surface of the second carrier are substantially noncoplanar.

2. The semiconductor device package of claim 1, wherein the first carrier and the second carrier include different materials.

3. The semiconductor device package of claim 1, wherein the first carrier includes a substrate or a redistribution layer (RDL).

4. The semiconductor device package of claim 1, wherein the second carrier includes a substrate, a flexible printed circuit (FPC) board or a RDL.

5. The semiconductor device package of claim 1, further comprising a second package body encapsulating the first electronic component and encapsulated by the first package body.

6. The semiconductor device package of claim 5, wherein lateral surfaces of the first package body, the second package body, the first carrier and the second carrier are noncoplanar.

7. The semiconductor device package of claim 5, wherein the second package body covers the lateral surface of the second carrier and the lateral surface of the first package body.

8. The semiconductor device package of claim 1, further comprising a shield disposed on a lateral surface of the first package body and the lateral surface of the second carrier.

9. The semiconductor device package of claim 8, wherein the shield is further disposed on the lateral surface of the first carrier.

10. The semiconductor device package of claim 1, wherein the second electronic component is electrically connected with the second carrier by the first carrier and the electrical connection structure.

11. The semiconductor device package of claim 1, wherein the second electronic component has a backside surface connected to the second surface of the first carrier and an active surface electrically connected to the surface of the second carrier.

12. The semiconductor device package of claim 1, further comprising an interconnection penetrating through a second package body, wherein the interconnection connects the first carrier to the second carrier.

13. A method of manufacturing a semiconductor device package comprising:
    (a) forming a first carrier having a first surface and a second surface opposite to the first surface;
    (b) disposing a first electronic component on the first surface of the first carrier;
    (c) forming an electrical connection structure and a second electronic component on the second surface of the first carrier; and
    (d) forming a second carrier to be electrically connected to the electrical connection structure, wherein the first carrier and the second carrier include different materials; and
    (e) forming a third electronic component and electrical contacts on a surface of the second carrier facing away from the first carrier.

14. The method of claim 13, before operation (c) further comprising forming a first package body on the first surface of the first carrier to cover the first electronic component.

15. The method of claim 13, before operation (d) further comprising forming a second package body on the second surface of the first carrier to cover the electrical connection structure and the second electronic component.

16. The method of claim 13, wherein in operation (d), a backside surface of the second electronic component is connected to the second surface of the first carrier through an adhesive layer.

17. The method of claim 13, wherein in operation (d), an active surface of the second electronic component is connected to the second surface of the first carrier through a solder ball.

18. The method of claim 13, further comprising forming a shield on a lateral surface of the first carrier and a portion of a lateral surface of the second carrier.

19. A semiconductor device package, comprising:
a first carrier having a first surface and a second surface opposite to the first surface;
a first electronic component disposed on the first surface of the first carrier;
a second carrier including an interconnection layer and a dielectric layer encapsulating a portion of the interconnection layer, the second carrier having a surface facing the second surface of the first carrier;
a second electronic component disposed between the first carrier and the second carrier, the second electronic component having a backside surface and an active surface, wherein the active surface is closer to the second surface of the first carrier than the backside surface is; and
an electrical connection structure electrically connecting the first carrier and the second carrier, wherein the electrical connection structure includes a soldering material, the first carrier includes an interconnection layer and a dielectric layer encapsulating a portion of the interconnection layer, and the dielectric layer of the first carrier includes a solder mask exposing the interconnection layer of the first carrier such that the interconnection layer of the first carrier is in contact with the electrical connection structure.

20. The semiconductor device package of claim 19, wherein a line/space (L/S) of the interconnection layer of the first carrier is greater than a line/space (L/S) of the interconnection layer of the second carrier.

21. The semiconductor device package of claim 19, wherein a distance between the backside surface of the second electronic component and the surface of the second carrier along a first direction is less a distance between the backside surface of the second electronic component and the second surface of the first carrier along the first direction, and wherein the first direction is substantially parallel to a normal direction of the first surface of the first carrier.

22. The semiconductor device package of claim 21, further comprising a shield disposed on a lateral surface of the first carrier and a portion of a lateral surface of the second carrier.

* * * * *